(12) United States Patent
Passlack et al.

(10) Patent No.: US 12,154,903 B2
(45) Date of Patent: Nov. 26, 2024

(54) FIN-BASED FIELD EFFECT TRANSISTORS

(71) Applicant: Taiwan Semiconductor Manufacturing Co., Ltd., Hsinchu (TW)

(72) Inventors: Matthias Passlack, Huldenberg (BE); Gerben Doornbos, Kessel-Lo (BE); Peter Ramvall, Lund (SE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/674,284

(22) Filed: Feb. 17, 2022

(65) Prior Publication Data
US 2022/0173102 A1 Jun. 2, 2022

Related U.S. Application Data

(63) Continuation of application No. 16/353,664, filed on Mar. 14, 2019, now Pat. No. 11,257,818.
(Continued)

(51) Int. Cl.
*H01L 21/8238* (2006.01)
*H01L 21/02* (2006.01)
(Continued)

(52) U.S. Cl.
CPC .... *H01L 27/0924* (2013.01); *H01L 21/02389* (2013.01); *H01L 21/0254* (2013.01);
(Continued)

(58) Field of Classification Search
CPC ......... H01L 21/823821; H01L 27/0924; H01L 29/41791
See application file for complete search history.

(56) References Cited

U.S. PATENT DOCUMENTS 7,300,837 B2 * 11/2007 Chen ................ H01L 29/66628
438/269
8,768,271 B1 7/2014 Then et al.
(Continued)

FOREIGN PATENT DOCUMENTS

CN 107230729 A 10/2017
JP 2017501562 A 1/2017
(Continued)

OTHER PUBLICATIONS

Chen, W., et al., *GaN nanowire fabricated by selective wet-etching of GaN micro truncated-pyramid*, vol. 426 Journal of Crystal Growth pp. 168-172 (2015).
(Continued)

*Primary Examiner* — Michele Fan
(74) *Attorney, Agent, or Firm* — Sterne, Kessler, Goldstein & Fox P.L.L.C.

(57) ABSTRACT

The present disclosure describes a semiconductor structure that includes a substrate from an undoped semiconductor material and a fin disposed on the substrate. The fin includes a non-polar top surface and two opposing first and second polar sidewall surfaces. The semiconductor structure further includes a polarization layer on the first polar sidewall surface, a doped semiconductor layer on the polarization layer, a dielectric layer on the doped semiconductor layer and on the second polar sidewall surface, and a gate electrode layer on the dielectric layer and the first polarized sidewall surface.

20 Claims, 24 Drawing Sheets

Related U.S. Application Data

(60) Provisional application No. 62/737,447, filed on Sep. 27, 2018.

(51) Int. Cl.

| | | |
|---|---|---|
| *H01L 21/308* | (2006.01) | |
| *H01L 27/092* | (2006.01) | |
| *H01L 29/20* | (2006.01) | |
| *H01L 29/51* | (2006.01) | |
| *H01L 29/66* | (2006.01) | |
| *H01L 29/78* | (2006.01) | |

(52) U.S. Cl.
CPC .. *H01L 21/3086* (2013.01); *H01L 21/823807* (2013.01); *H01L 21/823821* (2013.01); *H01L 21/823828* (2013.01); *H01L 21/823864* (2013.01); *H01L 29/2003* (2013.01); *H01L 29/518* (2013.01); *H01L 29/66795* (2013.01); *H01L 29/7851* (2013.01)

(56) References Cited

U.S. PATENT DOCUMENTS

| | | |
|---|---|---|
| 9,064,976 B1 | 6/2015 | Agarwal et al. |
| 9,318,622 B1 | 4/2016 | Logan et al. |
| 9,461,160 B2 | 10/2016 | Then et al. |
| 9,595,594 B2 | 3/2017 | Zhu |
| 9,660,085 B2 | 5/2017 | Then et al. |
| 9,947,780 B2 | 4/2018 | Then et al. |
| 9,978,872 B1 | 5/2018 | Hahn et al. |
| 10,170,612 B2 | 1/2019 | Dasgupta et al. |
| 10,964,806 B2 | 3/2021 | Longobardi et al. |
| 2006/0170053 A1* | 8/2006 | Yeo .................. H01L 29/66795 257/353 |
| 2011/0049629 A1* | 3/2011 | Ishikawa ............ H01L 27/1211 257/E27.06 |
| 2015/0249134 A1 | 9/2015 | Ostermaier et al. |
| 2016/0240617 A1* | 8/2016 | Then .................. H01L 21/0254 |
| 2016/0276433 A1 | 9/2016 | Holland et al. |
| 2017/0125521 A1 | 5/2017 | Fay et al. |
| 2017/0125555 A1 | 5/2017 | Fay et al. |
| 2017/0200820 A1 | 7/2017 | Conway et al. |
| 2017/0200833 A1 | 7/2017 | Conway et al. |
| 2017/0278968 A1 | 9/2017 | Lan et al. |
| 2017/0338229 A1 | 11/2017 | Oh et al. |
| 2018/0175184 A1* | 6/2018 | Then .................. H01L 29/2003 |
| 2018/0219087 A1* | 8/2018 | Dasgupta .......... H01L 21/02639 |
| 2018/0323106 A1 | 11/2018 | Dasgupta et al. |
| 2018/0350921 A1 | 12/2018 | Dasgupta et al. |
| 2020/0058782 A1* | 2/2020 | Then .................. H01L 29/7788 |
| 2020/0105760 A1 | 4/2020 | Passlack et al. |
| 2020/0235216 A1* | 7/2020 | Then .................. H01L 29/7786 |

FOREIGN PATENT DOCUMENTS

| | | |
|---|---|---|
| KR | 20140085540 A | 7/2014 |
| KR | 20150058498 A | 5/2015 |
| KR | 20160134872 A | 11/2016 |
| KR | 20170129278 A | 11/2017 |
| TW | 201606986 A | 2/2016 |
| TW | 201707062 A | 2/2017 |
| WO | WO 2018/063191 A1 | 4/2018 |
| WO | WO-201806391 A1 | 4/2018 |

OTHER PUBLICATIONS

Hiramatsu, K., et al., *Fabrication and characterization of low defect density GaN using facet-controlled epitaxial lateral overgrowth (FACELO)*, vol. 221 Journal of Chrystal Growth pp. 316-326 (2000).

Kim, H., et al., *High-Brightness Light Emitting Diodes Using Dislocation-Free Indium Gallium Nitride/Gallium Nitride Multiquantum-Well Nanorod Arrays*, vol. 4. No. 6 Nano Letters, American Chemical Society pp. 1059-1062 (2004).

Li, W., et al., *Polarization-Engineered III-Nitride Heterojunction Tunnel Field-Effect Transistors*, vol. 1 IEEE Journal on Exploratory Solid-State Computational Devices and Circuits pp. 28-34 (2015).

Lundskog, A., et al., *Controlled growth of hexagonal GaN pyramids by hot-wall MOCVD*, vol. 363 Journal of Crystal Growth pp. 287-293 (2013).

Yeh, T., et al., *InGaN/GaN Multiple Quantum Wells Grown on Nonpolar Facets of Vertical GaN Nanorod Arrays*, vol. 12. Nano Letters, American Chemical Society pp. 3257-3262 (2012).

\* cited by examiner

1300

```
┌─────────────────────────────────────────────────┐
│   Form a GaN fin on an undoped GaN layer        │──  1310
└─────────────────────────────────────────────────┘
                        ▼
┌─────────────────────────────────────────────────┐
│   Grow an InGa$_x$N polarization layer on a sidewall │──  1320
│            surface of the GaN fin                │
└─────────────────────────────────────────────────┘
                        ▼
┌─────────────────────────────────────────────────┐
│   Grow a doped GaN layer on the InGa$_x$N polarization │──  1330
│                      layer                       │
└─────────────────────────────────────────────────┘
                        ▼
┌─────────────────────────────────────────────────┐
│   Deposit an AlN dielectric layer on both sidewall │──  1340
│             surfaces of the GaN fin              │
└─────────────────────────────────────────────────┘
                        ▼
┌─────────────────────────────────────────────────┐
│  Deposit a gate electrode layer on the dielectric layer │──  1350
│            and on the InN polarization layer     │
└─────────────────────────────────────────────────┘
                        ▼
┌─────────────────────────────────────────────────┐
│     Form source and drain contact electrodes    │──  1360
└─────────────────────────────────────────────────┘
```

FIG. 13

FIN-BASED FIELD EFFECT TRANSISTORS

CROSS-REFERENCE TO RELATED APPLICATION

This application is a continuation of U.S. patent application Ser. No. 16/353,664, titled "Fin-Based Field Effect Transistors" and filed on Mar. 14, 2019, now allowed, which claims the benefit of U.S. Provisional Patent Application No. 62/737,447, titled "Fin Based MOSFETs and Tunnel FETs (TFETs)" and filed on Sep. 27, 2018, which are both incorporated herein by reference in their entireties.

BACKGROUND

Metal oxide semiconductor field effect transistor (MOSFET) scaling has been a preferred design choice to increase the performance of silicon complementary metal oxide semiconductor (CMOS) technology. As device scaling has resulted in smaller transistors, the resulting larger device density has resulted in power densities on the order of 100 W/cm$^2$. Further scaling would further increase power density and lead to transistor damage.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 13 is a flow chart of a method for the formation of n-type and p-type tunnel field effect transistors, in accordance with some embodiments.

DETAILED DESCRIPTION

Figure 1:
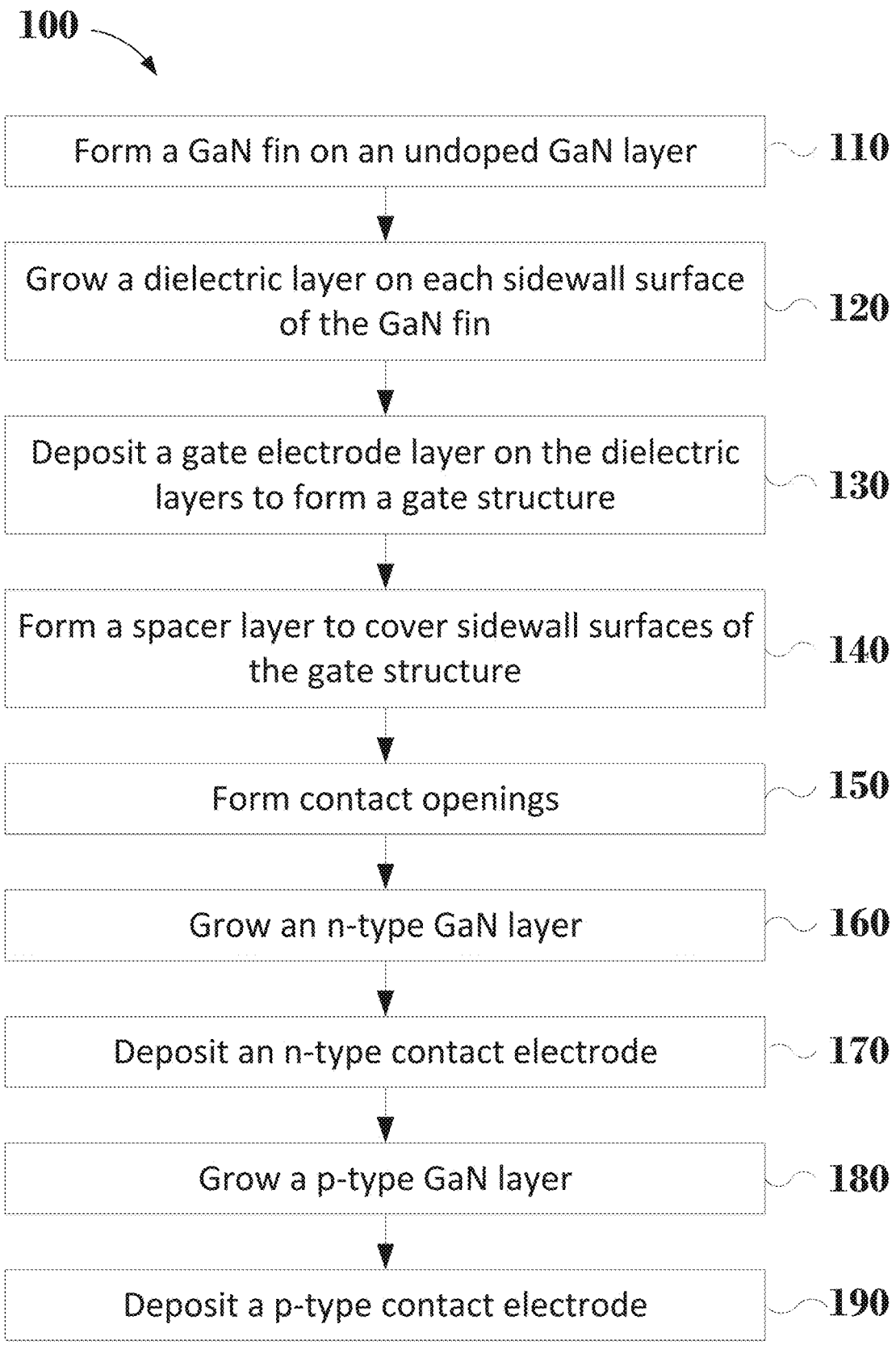
FIG. 1 is a flow chart of a method for the formation of n-type and p-type field effect transistors on a gallium nitride fin, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. In some embodiments, based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. In some embodiments, based on the particular technology node, the term "about" can indicate a value of a given quantity that varies within, for example, 10-30% of the value (e.g., ±10%, ±20%, or ±30% of the value).

The term "vertical," as used herein, means nominally perpendicular to the surface of a substrate.

In mobile applications, which have a high density of transistors per unit area, heat generation and dissipation can be challenging. A way to control the heat generation in circuitries with large device densities is to reduce the power consumed by the metal oxide field effect transistors (MOSFETs). Since the drive voltage of a MOSFET exhibits a quadratic power dependence, reduction of the drive voltage would lower the power consumed by the MOSFETs. However, lowering the drive voltage will also reduce the on-state current and decrease the ratio between the on-state current and the off-state current. A way to reduce the MOSFET's drive voltage, but to maintain the transistor's on-state to off-state current ratio, is to reduce the MOSFET's sub-threshold swing. However, at room temperature, the sub-threshold swing is fixed at 60 mV/decade and poses a fundamental limit to power scaling.

The tunnel field-effect transistor (TFET) is a type of transistor whose structure is similar to that of a MOSFET. However, the switching mechanism is different between the two structures, making the TFET a promising candidate for low power electronics. TFETs switch by modulating quantum tunneling through a barrier instead of modulating thermionic emission over a barrier as in MOSFETs. Accordingly, TFETs are not limited by the thermal tail of carriers, which limits the MOSFET's sub-threshold swing to about 60 mV/decade at room temperature. TFETs can achieve a sub-threshold voltage swing below 60 mV/decade (e.g., about 40 mV/decade). TFET drive voltage can thus be scaled to reduce the power consumption without the penalty of a reduced on-state to off-state current ratio.

Integration of TFETs using III-V materials, like indium arsenide (InAs) and gallium antimony (GaSb), with silicon MOSFETs can be challenging because III-V materials have low thermal tolerances (e.g., below 200° C.) and the resulting TFET structures can suffer from poor mechanical stability. Meanwhile, silicon-based TFETs do not offer appreciable current characteristics.

The embodiments described herein are directed to the integration of FET and TFET structures by using group III-nitride materials, such as gallium nitride, aluminum nitride, and aluminum gallium nitride. Consequently, the resulting FET structures can be used for high drive voltage operations (e.g., between about 0.6 V and about 1.2 V) and the resulting TFET structures can be used for low drive voltage operations (e.g., about 0.3 V). Both the FET and TFET structures are fabricated with a fin-based architecture that offers: (i) mechanical stability suitable for ultra-small devices, (ii) seamless integration between FETs and TFETs, and (iii) increased device density. In some embodiments, the fabricated FETs and TFETs include polar interfaces, which function as localized interface polarization charge planes that induce respective sheet charge densities within the fin. Therefore, with the use of polar interfaces, both p-channel FETs and n-channel FETs can be formed on a single fin, which can further reduce the footprint of the resulting FET structures. According to some embodiments, an undoped, etched gallium nitride fin is the starting point for both the FET and TFET structures. Further, the use of a single crystal dielectric material as the gate dielectric effectively reduces the interface state density ($D_{it}$) in TFETs and improves off-current limitations.

FIG. 1 is a flow chart of an exemplary method 100 for the fabrication of an inverter with reduced footprint. More specifically, the inverter includes a p-type FET structure and an n-type FET structure formed on a single fin. The p-type and n-type FET structures are fabricated using III-nitride materials and can be operated with drive voltages between about 0.7 V and about 1.2 V. Other fabrication operations may be performed between the various operations of method 100 and may be omitted merely for clarity. Embodiments of the present disclosure are not limited to method 100.

Fabrication method 100 begins with operation 110 and the formation of a gallium nitride (GaN) fin on an undoped GaN layer. In some embodiments, the undoped GaN layer is epitaxially grown on a wafer, such as a silicon wafer, a sapphire wafer, or a silicon carbide wafer. In some embodiment, the GaN layer is grown so that its top surface is parallel to the m-plane {1$\bar{1}$00}. According to some embodiments, the m-plane {1$\bar{1}$00} is a non-polar plane—for example, the net polarization is zero. By way of example and not limitation, the fin can be formed by depositing and patterning a photoresist layer on the top surface of the GaN layer, and etching with a dry etching process the exposed GaN layer to form the GaN fin. The patterned photoresist layer can be used as an etch mask during the aforementioned dry etching process. In some embodiments, the dry etching process is anisotropic so that the fin is formed with substantially vertical side surfaces (sidewalls). After the dry etching process, the patterned photoresist can be removed with a wet etching process.

Figure 2A:
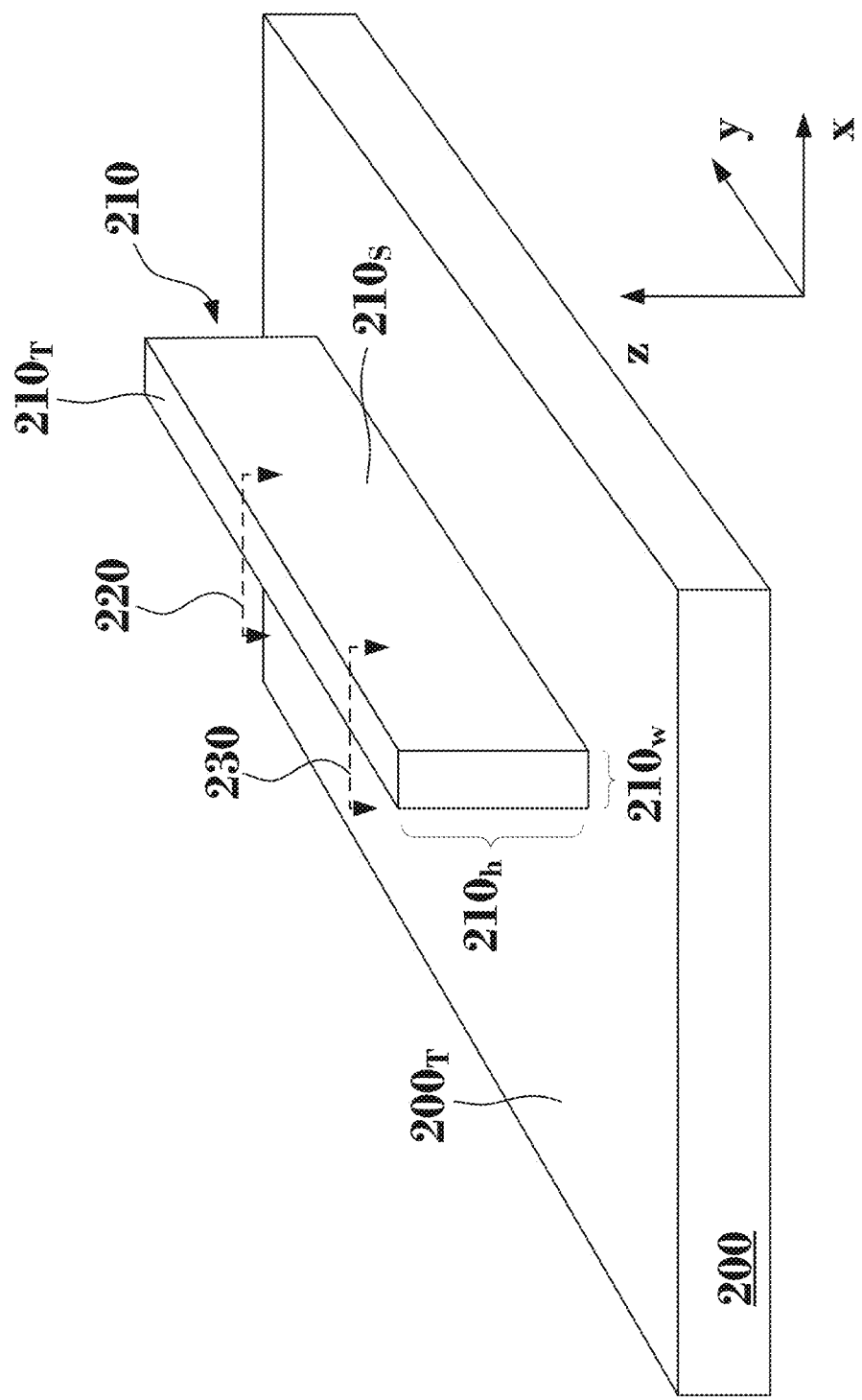
FIG. 2A is an isometric view of a gallium nitride fin on a gallium nitride substrate, in accordance with some embodiments.

According to some embodiments, FIG. 2A is an isometric view of the resulting structure from operation 110, where a fin 210 is formed on an etched GaN layer 200. In FIG. 2A, the wafer that supports GaN layer 200 is not shown for simplicity. Because fin 210 has been formed from GaN layer 200, its top surface $210_T$ has the same crystal orientation with top surface $200_T$ of GaN layer 200 (e.g., parallel to the m-plane {1$\bar{1}$00}). In some embodiments, the orientation of the patterned photoresist along the x-y plane is such that when fin 210 is formed, the fin's sidewall surfaces $210_S$ are parallel to the c-plane {0001} because the c-plane {0001} is a polar plane, which means that the net polarization along the c-plane is non-zero and localized polarization charge is present. More specifically, one sidewall surface $210_S$ can be parallel to the (0001) plane and the opposite sidewall surface $210_S$ can be parallel to the (000$\bar{1}$) plane.

Figure 2B:
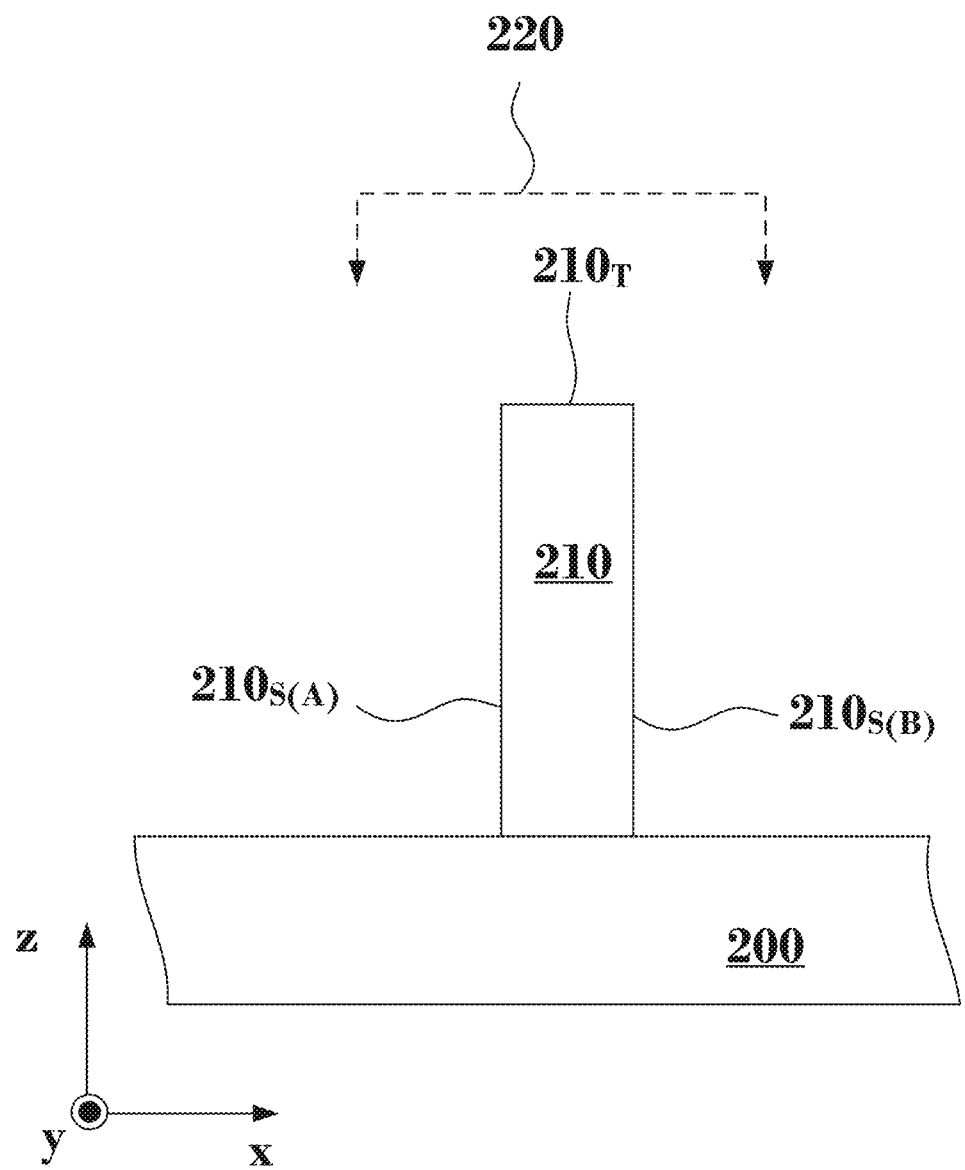
FIG. 2B is a cross-sectional view of a gallium nitride fin on a gallium nitride substrate along the x-axis, in accordance with some embodiments.

FIG. 2B is a cross sectional view of fin 210 across a cut line 220, where a fin sidewall surface $210_{S(A)}$ is parallel to the (0001) plane and a surface $210_{S(B)}$ is parallel to the (000$\bar{1}$) plane.

In referring to FIG. 2A, fin 210 has a height $210_h$ between about 30 nm and about 50 nm (e.g., between about 30 nm and about 40 nm, between about 35 nm and about 45 nm, between about 40 nm and about 50 nm). Further, fin 210 has a width $210_w$ between about 5 nm and about 10 nm (e.g., about 5 nm, about 8 nm, about 9 nm, about 10 nm, etc.). By way of example and not limitation, the length of fin 210 can be about 80 nm. Taller and narrower fins are possible; however, the mechanical rigidity of such fin structures can be poor. Further, wider fins (e.g., wider than 10 nm) can impact the device density, since wider fins will occupy a larger surface area of GaN layer 200.

For example purposes, the subsequent fabrication operations will be described using cross-sectional views of fin 210 across cut lines 220 and 230 along the x-axis, and cross-sectional views along the y-axis.

Figure 3A:
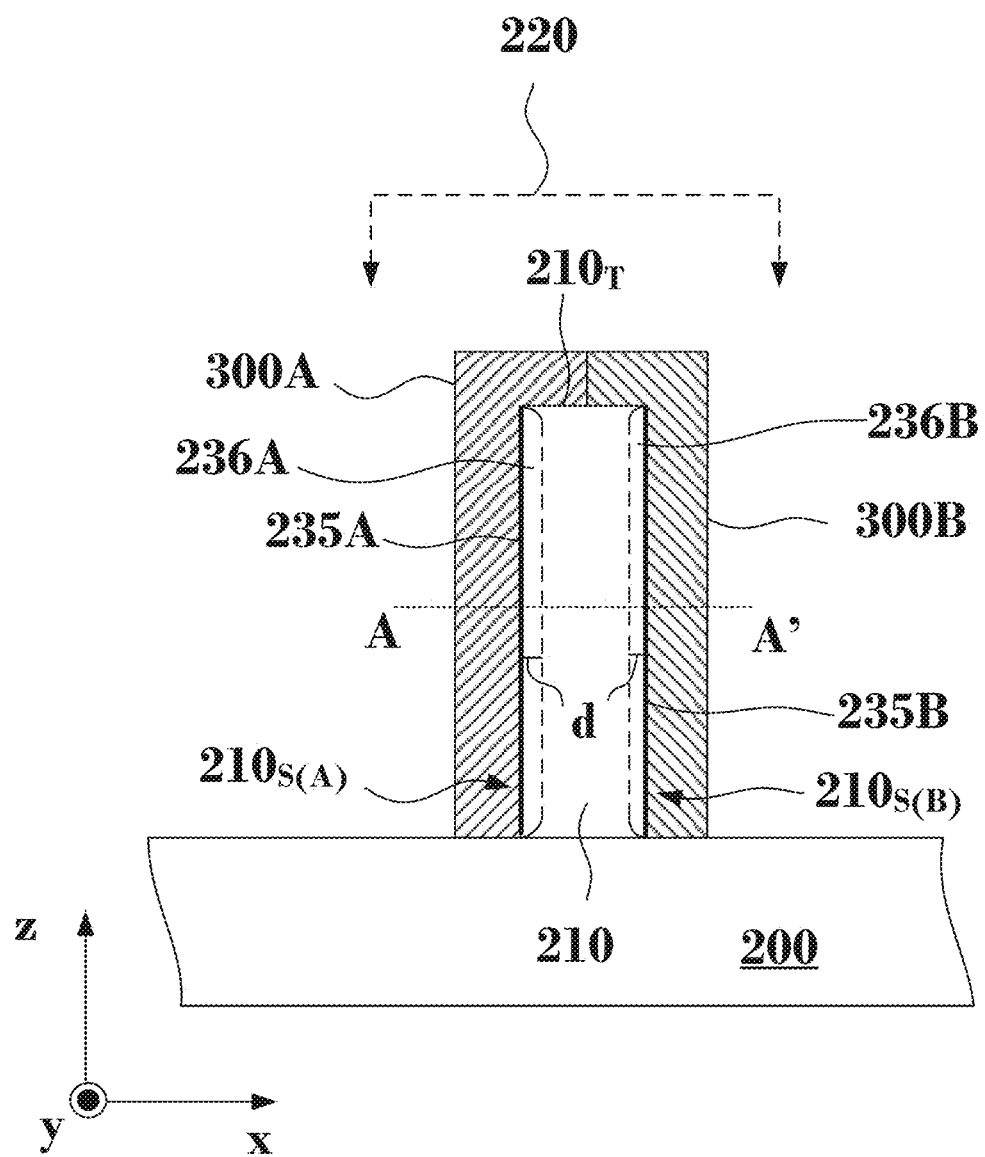
FIG. 3A is a cross-sectional view of a gallium nitride fin on a gallium nitride substrate along the x-axis with a dielectric layer formed thereon, in accordance with some embodiments.

In referring to FIG. 1, method 100 continues with operation 120, where a polar layer (e.g., a dielectric layer) is grown on each sidewall surface $210_S$ of fin 210. FIG. 3A is a cross sectional view of fin 210 across cut line 220 of FIG. 2. By way of example and not limitation, the polar layers grown on each sidewall surface $210_S$ of fin 210 will be described in the context of a dielectric layer. For example, in FIG. 3A, dielectric layer 300A is grown on a sidewall surface $210_{S(A)}$ of fin 210 and dielectric layer 300B is grown on an opposite sidewall surface $210_{S(B)}$ of fin 210. In some embodiments, dielectric layers 300A and 300B are referred to as a "dielectric shell" and include aluminum gallium nitride (AlGa$_x$N), where the amount of Ga 'x' can be equal to or greater than zero (e.g., x≥0).

In some embodiments, AlGa$_x$N dielectric layers 300A and 300B are identical or have a different mole fraction ratio (e.g., Al to N composition ratio and/or Ga concentration). Further, AlGa$_x$N dielectric layers 300A and 300B can be grown with the same or different thickness. By way of example and not limitation, in the event that AlGa$_x$N dielectric layers 300A and 300B have the same thickness and mole fraction ratio, they can be deposited in a single deposition. On the other hand, if AlGa$_x$N dielectric layers 300A and 300B have a different thickness and/or mole fraction ratio, they can be deposited sequentially. For example, a sacrificial layer, not shown in FIG. 3A, can cover one sidewall surface $210_S$ (e.g., sidewall surface $210_{S(B)}$) of fin 210, while the opposite sidewall surface $210_S$ (e.g., sidewall surface $210_{S(A)}$) of fin 210 is exposed. The AlGa$_x$N can then be deposited on the exposed sidewall surface $210_S$ of fin 210. Subsequently, the deposited sidewall surface $210_S$ of fin 210 is covered, and the un-deposited sidewall surface $210_S$ of fin 210 is exposed. The AlGa$_x$N is then deposited on the exposed un-deposited sidewall surface $210_S$ of fin 210. In some embodiments, AlGa$_x$N dielectric layers 300A and 300B cover all the surfaces of fin 210, including top surface $210_T$.

During each deposition, the thickness and the mole fraction ratio of each of AlGa$_x$N dielectric layers 300A and 300B can be controlled via the deposition process parameters. In some embodiments, AlGa$_x$N dielectric layers 300A and 300B are deposited by metal organic chemical vapor deposition (MOCVD). In some embodiments, AlGa$_x$N dielectric layers 300A and 300B have a thickness range between about 1 nm to about 3 nm (e.g., about 1 nm, about 1.5 nm, about 2 nm, about 2.5 nm, about 3 nm). In some embodiments AlGa$_x$N dielectric layers 300A and 300B have a dielectric constant (k-value) of about 9.5. In some embodiments, dielectric layers 300A and 300B have a crystalline structure that reduces the interface state density Da between each of the dielectric layers and their respective sidewall surface of the fin. This in turn can facilitate low power operation of the formed transistors.

According to some embodiments, localized charge forms at the interface between GaN fin 210 and AlGa$_x$N dielectric layers 300A and 300B due to different amounts of spontaneous and piezoelectric polarization in the bulk of each material (e.g., GaN and AlGa$_x$N). The resulting localized interface polarization charge is the difference of the bulk polarization in both materials. According to some embodiments, 235A and 235B are localized interface polarization charge densities at the interface between GaN fin 210 and AlGa$_x$N dielectric layers 300A and 300B respectively. For example, each of the localized interface polarization charge densities 235A and 235B can be thought of as two dimensional (2-D) planes extending on the y-z plane (e.g., sidewall surfaces $210_{S(A)}$ and $210_{S(B)}$) without an x-axis component (e.g., x=0). By way of example and not limitation, the localized polarization charge density at the interface between GaN and AlGa$_x$N can be defined as the difference between the GaN polarization and the AlGa$_x$N polarization. For example, assuming that the GaN is unstrained and the AlGa$_x$N dielectric layers 300A and 300B are tensile strained, localized interface polarization charge density 235A can be about 0.104 C/cm$^2$ (e.g., equal to about +6.5×10$^{13}$/cm$^2$) at $210_{S(A)}$ (e.g., along the (0001) plane) and localized interface polarization charge density 235B can be about −0.104 C/cm$^2$ (e.g., equal to about −6.5×10$^{13}$/cm$^2$) at $210_{S(B)}$ (e.g., along the (000$\bar{1}$) plane). The opposite sign of the interface polarization charge allows the formation of nFET and pFET on a single undoped GaN fin. Each of the localized interface polarization charge densities (e.g., 235A and 235B) can include spontaneous polarization and piezoelectric polarization components, with the piezoelectric polarization component depending on the presence or absence of strain in each respective layer (e.g., GaN and AlGa$_x$N). By way of example and not limitation, as the amount of Ga 'x' increases in the AlGa$_x$N layer, the lattice mismatch between the GaN and AlGa$_x$N increases. Since the lattice mismatch contributes to strain and the materials discussed here are polar semiconductors, strain results in polarization charge. Further, the amount of polarization charge can increase with the amount of strain (e.g., with the amount of Ga 'x' in AlGa$_x$N). Subsequently, the amount of polarization charge, and therefore the strain, can be used to modulate the threshold voltage of the FETs. In some embodiments, the absolute localized interface polarization charge densities 235A and 235B of about 0.104 C/cm$^2$ can induce respective GaN absolute surface sheet charge densities 236A and 236B greater than about 5×10$^{12}$/cm$^2$, depending on gate bias conditions. For example, GaN surface sheet charge densities 236A and 236B on respective sidewall surface $210_{S(A)}$ and $210_{S(B)}$ can be greater than about −5×10$^{12}$/cm$^2$ and about +5×10$^{12}$/cm$^2$, respectively, depending on gate bias conditions. Surface sheet charge densities 236A and 236B can be thought of as "quasi-2D" because they extend along the y-z plane (e.g., sidewall surfaces $210_{S(A)}$ and $210_{S(B)}$) and include a small x-axis component (e.g., x≠0). Therefore, as the name suggests, surface sheet charge densities 236A and 236B form a sheet with a non-zero x-axis value. Therefore, the "thickness" (e.g., the x-axis value) for each of the GaN surface sheet charge densities 236A and 236B can range between about 10 Å and about 30 Å (e.g., about 10 Å, about 15 Å, about 20 Å, about 25 Å, about 30 Å, etc.), where the thickness refers to a distance d measured from each sidewall surface $210_S$ towards the center of fin 210 along the x-axis, as shown in FIG. 3A. In some embodiments, the localized polarization charge densities 235A and 235B at the interface between GaN and AlGa$_x$N can be modulated through the thickness and/or the amount of Ga 'x' incorporated in dielectric layers 300A and 300B. In some embodiments, the localized polarization charge densities 235A and 235B at the interface between each of dielectric layers 300A and 300B and fin 210 respectively are controlled by the amount of Ga 'x' in the AlGa$_x$N dielectric layer. Therefore, the amount of Ga in AlGa$_x$N can be tailored based on the desired amount of localized interface polarization charge density (e.g., 235A and 235B) and the corresponding GaN surface sheet charge density (e.g., 236A and 236B) required for optimum nFET or pFET operation and performance.

The positive localized polarization charge 235A at the GaN/AlGa$_x$N interface (e.g., at sidewall surface $210_{S(A)}$) and the negative localized polarization charge 235B at the GaN/AlGa$_x$N interface (e.g., at sidewall surface $210_{S(B)}$) function in a way analogous to donor and acceptor planes, respectively, for n-type (n-channel) and p-type (p-channel) FETs formed on GaN fin 210. Therefore, according to some embodiments, an n-type (or n-channel) FET (hereinafter also referred to as "nFET") can be formed on fin sidewall surface $210_{S(A)}$ and a p-type (or p-channel) FET (hereinafter also referred to as "pFET") can be formed on fin sidewall surface $210_{S(B)}$.

According to some embodiments, there is minimal or no current flow across the body of fin 210 (e.g., between GaN surface sheet charge densities 236A and 236B). This is because localized polarization charges at the GaN/AlGa$_x$N interfaces (e.g., on sidewall surfaces $210_{S(A)}$ and $210_{S(B)}$) have opposite signs (e.g., positive and negative respectively), which in turn creates an electric field across fin 120 that (a) confines the resulting mobile surface sheet charge in GaN at the GaN/AlGa$_x$N interfaces and (b) depletes charge from the body of fin 120.

Figure 3B:
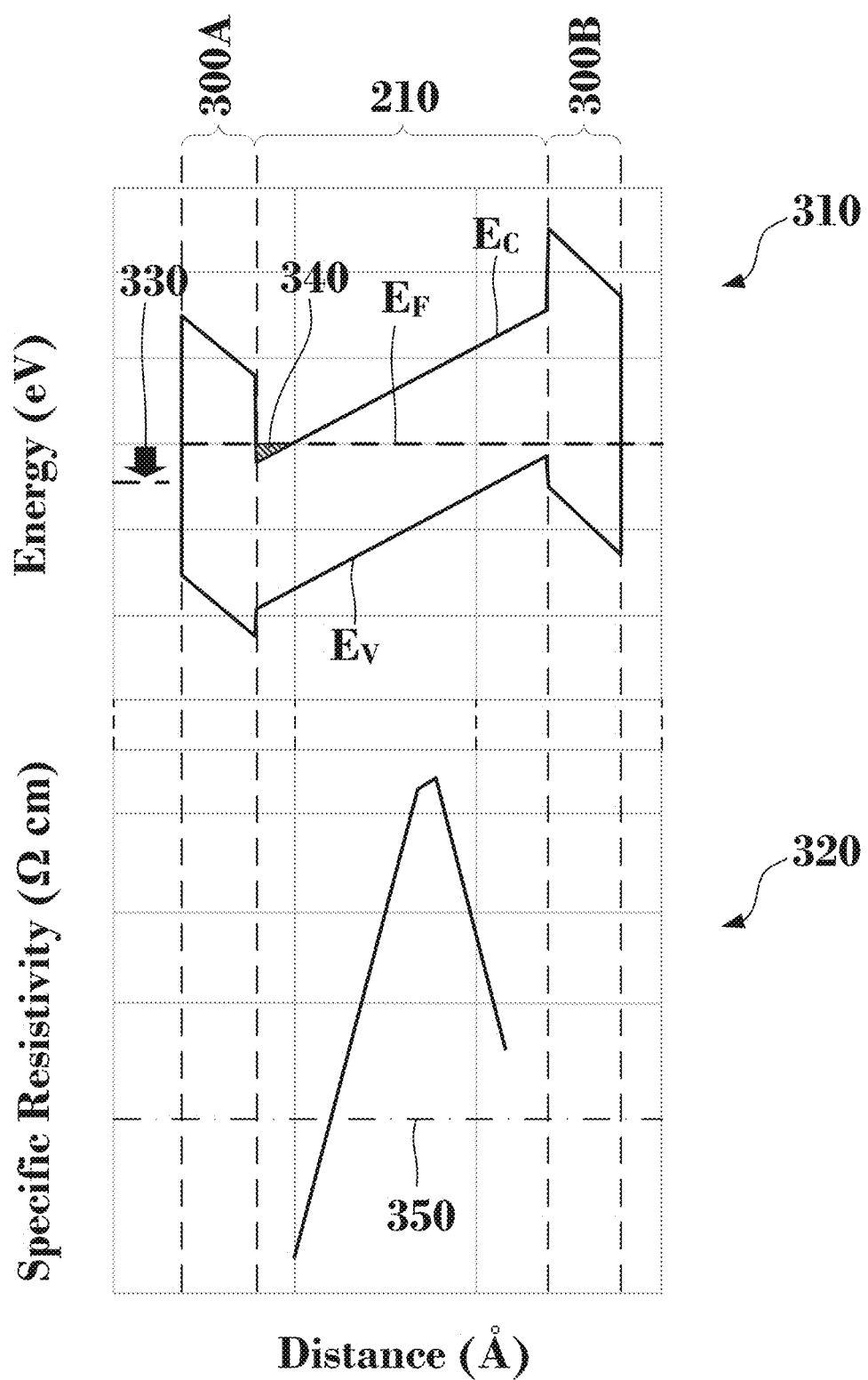
FIG. 3B is a simulated band energy diagram across an inverter structure formed on a single gallium nitride fin under a biasing condition with a corresponding specific resistivity plot of the gallium nitride fin, in accordance with some embodiments.

FIG. 3B shows a simulated energy band diagram 310 of the structure shown FIG. 3A along line AA' (e.g., across dielectric layer 300A, fin 210, dielectric layer 300B), when a positive voltage (e.g., +1 Volt) is applied across dielectric layer 300A and no voltage (e.g., 0 Volt) is applied across dielectric layer 300B. By way of example and not limitation, simulated energy band diagram 310 has been generated assuming a fin width 210w of about 8 nm and an equivalent oxide thickness (EOT) for dielectric layer 300A and 300B of about 0.87 nm.

As a result of the aforementioned biasing conditions, the nFET formed on fin sidewall surface $210_{S(A)}$ will be in an ON state (e.g., under strong inversion) and the pFET formed on fin sidewall surface $210_{S(B)}$ will be in an OFF state. Due to the application of the positive voltage (e.g., +1 Volt) across the dielectric layer 300A, the Fermi level ($E_F$) of an electrode in contact with 300A is "pushed" downwards as indicated by arrow 330. Meanwhile, the $E_F$ of the GaN fin 210 is constant and the conduction band ($E_C$) of GaN fin 210 "bends" downwards to a point where it crosses the $E_F$. Therefore, a negative surface sheet charge accumulates at the interface between fin 210 and dielectric layer 300A as indicated by shaded region 340. In some embodiments, shaded region 340 corresponds to the surface sheet charge density 236A shown in FIG. 3A. Further, the width of shaded region 340 along the x-axis corresponds to distance d of the GaN surface sheet charge density 236A shown in FIG. 3A and demonstrates that the surface sheet charge is quasi-2D—e.g., confined in the vicinity of interface between fin 210 and dielectric layer 300A with a non-zero x-axis value.

FIG. 3B also includes a specific resistivity plot 320 for fin 210 of FIG. 3A along the AA' line on a logarithmic scale. Both plots (e.g., simulated energy band diagram 310 and specific resistivity plot 320) share the same x-axis, which corresponds to the x-axis of FIG. 3A. According to specific resistivity plot 320, the specific resistivity increases within GaN fin 210 up to about $10^{23}$ Ωcm in the center of the fin. This means that the bulk of fin 210 is highly resistive, and therefore there is minimal or no current flow across the body of fin 210 (e.g., between GaN surface sheet charge densities 236A and 236B shown in FIG. 3A). As discussed above, this is because localized polarization charges at the GaN/AlGa$_x$N interfaces (e.g., on sidewall surfaces $210_{S(A)}$ and $210_{S(B)}$) have opposite signs (e.g., positive and negative respectively), which in turn creates an electric field across fin 120 that (a) confines the resulting mobile surface sheet charge in GaN at the GaN/AlGa$_x$N interfaces and (b) depletes charge from the body of fin 120. For comparison, specific resistivity plot 320 also includes the intrinsic resistivity limit of undoped silicon (e.g., about $4 \times 10^5$ Ωcm) as indicated by line 350.

Since top surface $210_T$ of fin 210 is parallel to the non-polar m-plane {1$\bar{1}$00}, there is an absence of polarization charge and, consequently, no FET (n-type or p-type) formation on top surface $210_T$ of fin 210.

As discussed above, the nFET and pFET can be formed to have different localized interface polarization charge densities based on the thicknesses and compositions of dielectric layers 300A and 300B, respectively. This flexibility allows the formation of an nFET and a pFET with different specifications based on circuit requirements The presence of interface polarization charges eliminates the need for implant processes and/or chemically doped regions in GaN fin 210. Further, interface polarization charges are advantageous compared to implants for the following reasons: (i) the interface polarization charges are extremely localized; (ii) their respective density (e.g., 235A and 235B) can be controlled via the growth of dielectric layers 300A and 300B; and (iii) they do not require activation annealing or additional processing. By contrast, an implant process would not be able to replicate such a sharp doping profile at the sidewall surfaces of fin 210 due to the tendency of dopants to diffuse, even at room temperature.

Figure 4:
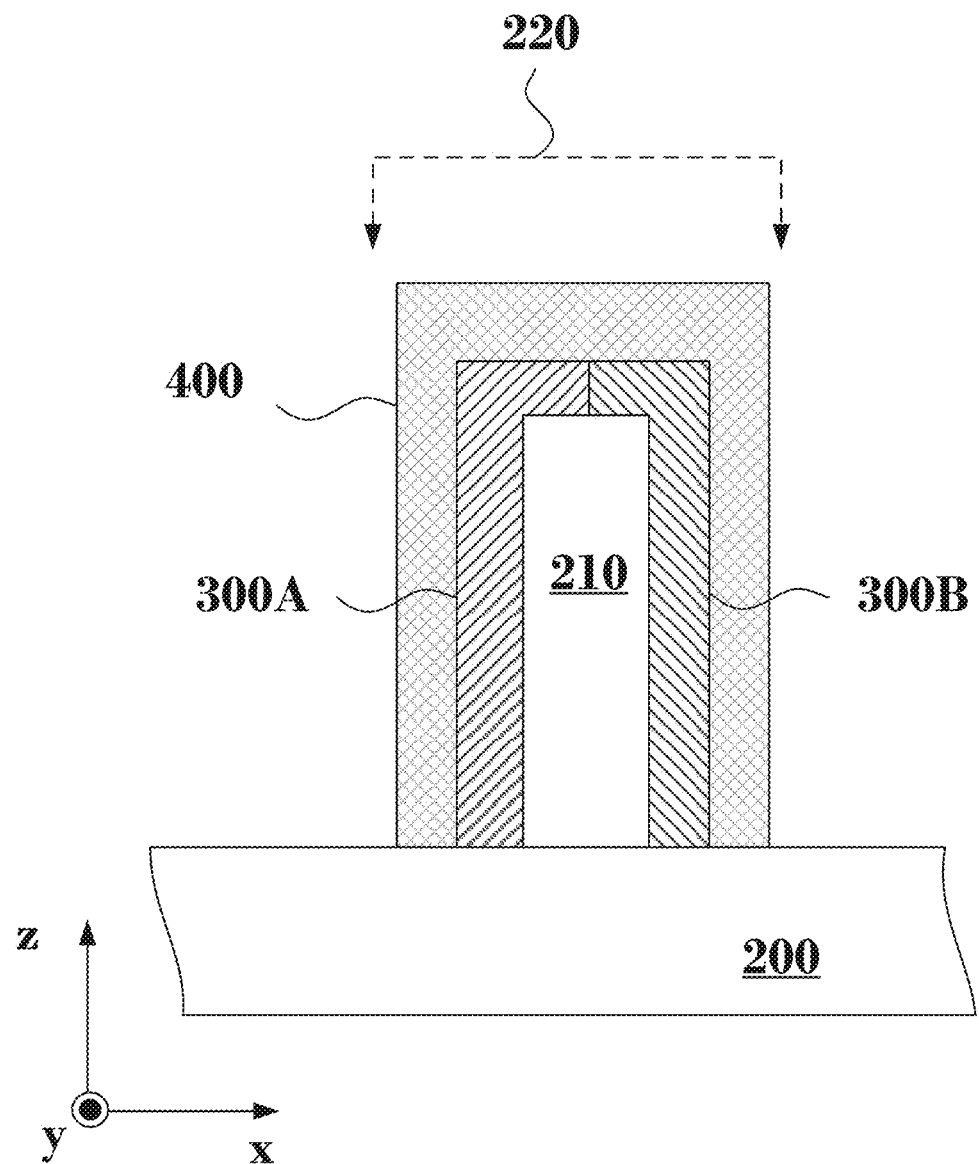
FIG. 4 is a cross-sectional view of a gallium nitride fin on a gallium nitride substrate along the x-axis with a gate electrode layer formed thereon, in accordance with some embodiments.

In referring to FIG. 1, method 100 continues with operation 130 and the deposition of a gate electrode layer on AlGa$_x$N dielectric layers 300A and 300B. In some embodiments, the gate electrode layer is common between sidewall surfaces $120_{S(A)}/120_{B(S)}$ and can be deposited with atomic layer deposition (ALD) on AlGa$_x$N dielectric layers 300A and 300B at a thickness of about 3 nm. In some embodiments, gate electrode layer 120 is different between sidewall surfaces $120_{S(A)}$ and $120_{S(B)}$ and is deposited successively on respective sidewall surfaces $120_{S(A)}$ and $120_{B(S)}$ in a manner similar to the formation of different dielectric layers 300A and 300B on sidewall surfaces $120_{S(A)}$ and $120_{B(S)}$ described above. In some embodiments, the gate electrode layer can include one or more metals, one or more metal alloys, one or more metallic layers, or combinations thereof. By way of example and not limitation, the gate electrode layer can include tungsten, aluminum-titanium alloys, titanium nitride, tantalum nitride, titanium, other metals, other alloys, metal nitrides, or combinations thereof. FIG. 4 shows the resulting structure after the deposition of a gate electrode layer 400. Though not shown in FIG. 4, gate electrode layer 400 covers the entire fin 210.

Figure 5:
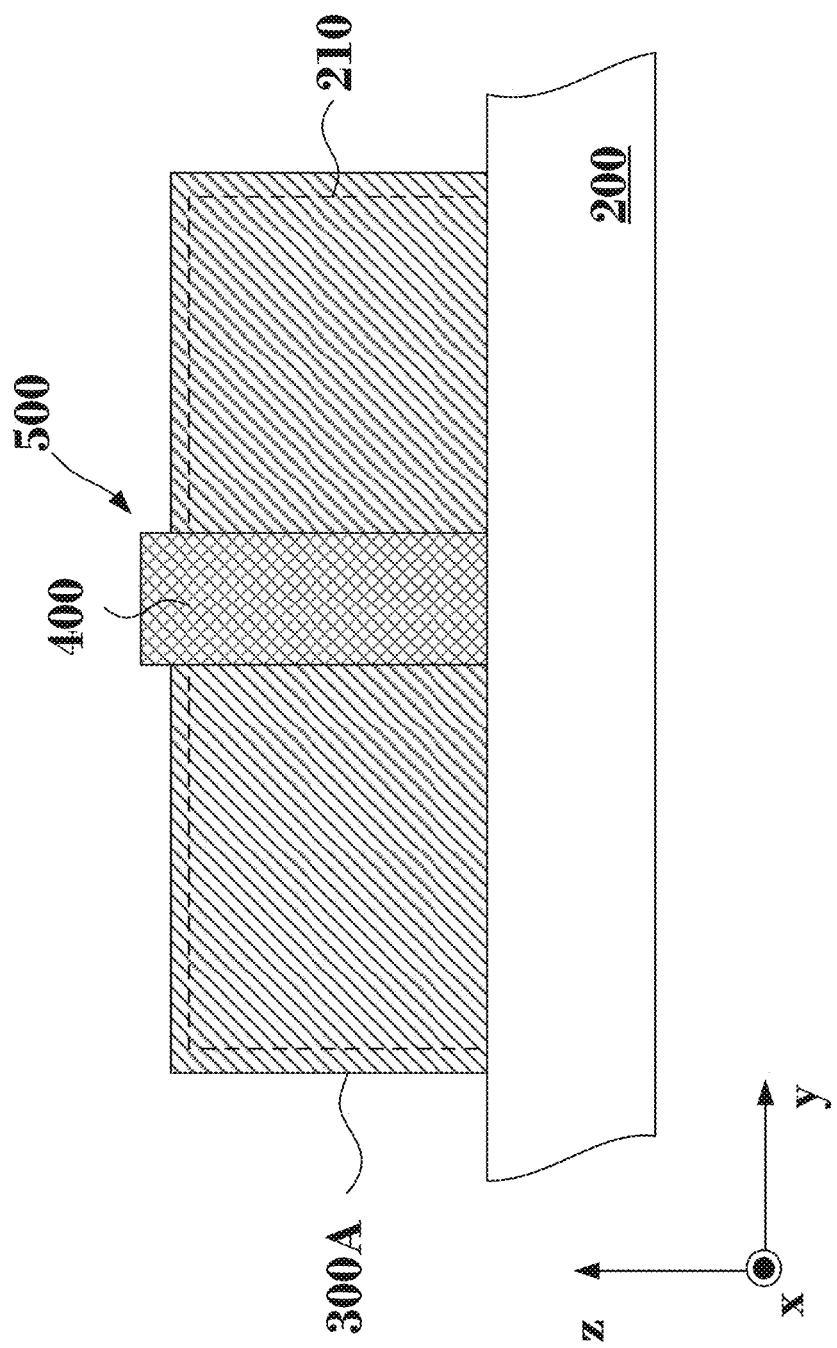
FIG. 5 is a cross-sectional view of a gallium nitride fin on a gallium nitride substrate along the y-axis with a patterned gate electrode layer, in accordance with some embodiments.

In some embodiments, the deposited gate electrode layer 400 is patterned on fin 210 and dielectric layers 300A and 300B with photolithography and etching operations to form a gate structure that covers a portion of fin 210 (e.g., a middle portion of fin 210). Other portions of fin 210 are covered with dielectric layers 300A and 300B as a result of the patterning process. FIG. 5 is a cross-sectional view of fin 210 along the length of fin 210 (e.g., along the y-axis) that shows a resulting gate structure 500 after the aforementioned patterning process. In FIG. 5, the outline of fin 210, which is covered by $AlGa_xN$ dielectric layer 300A, is shown by a dotted line.

Figure 6:
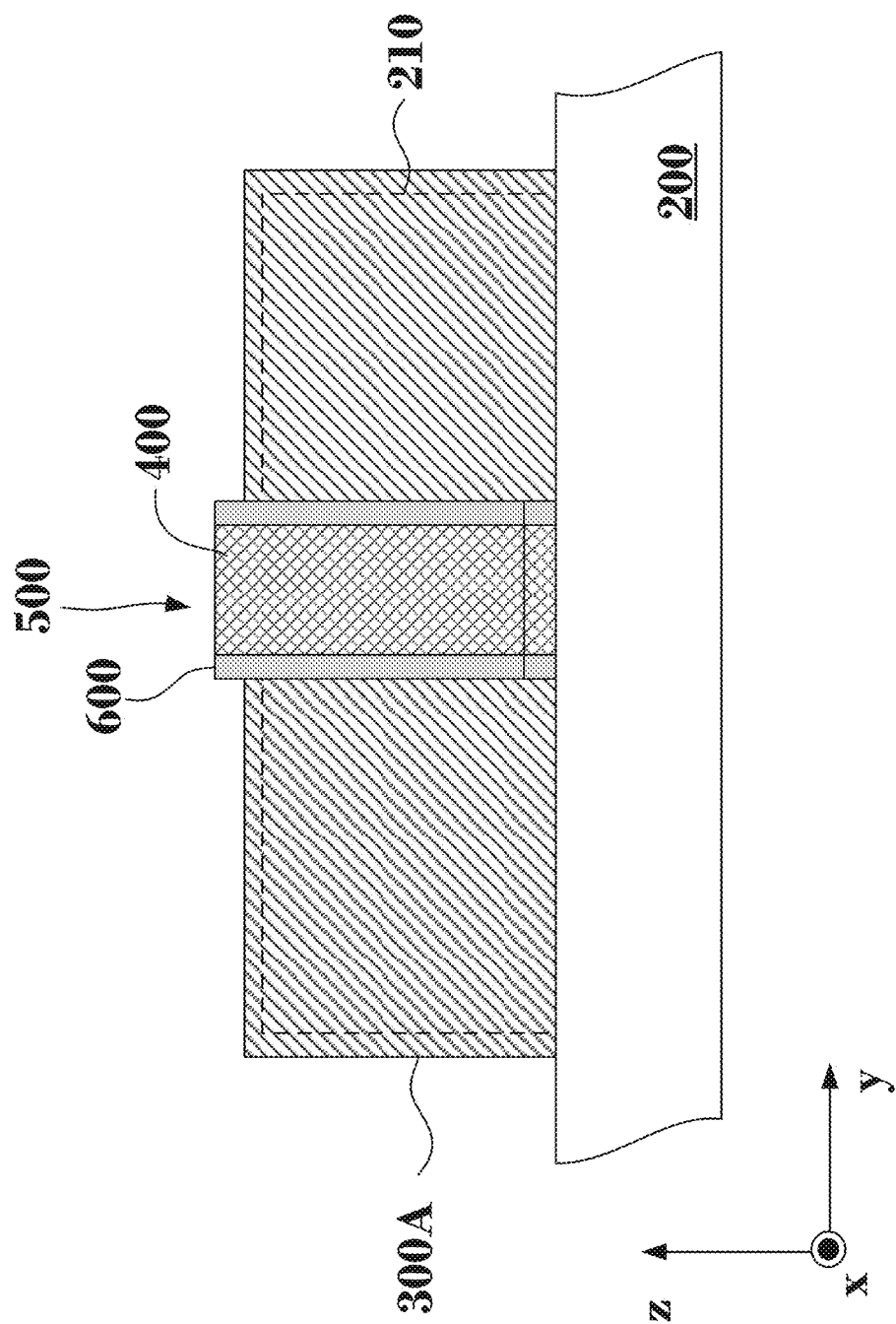
FIG. 6 is a cross-sectional view of a gallium nitride fin on a gallium nitride substrate along the y-axis with a spacer formed on sidewalls of a patterned gate electrode layer, in accordance with some embodiments.
Figure 7:
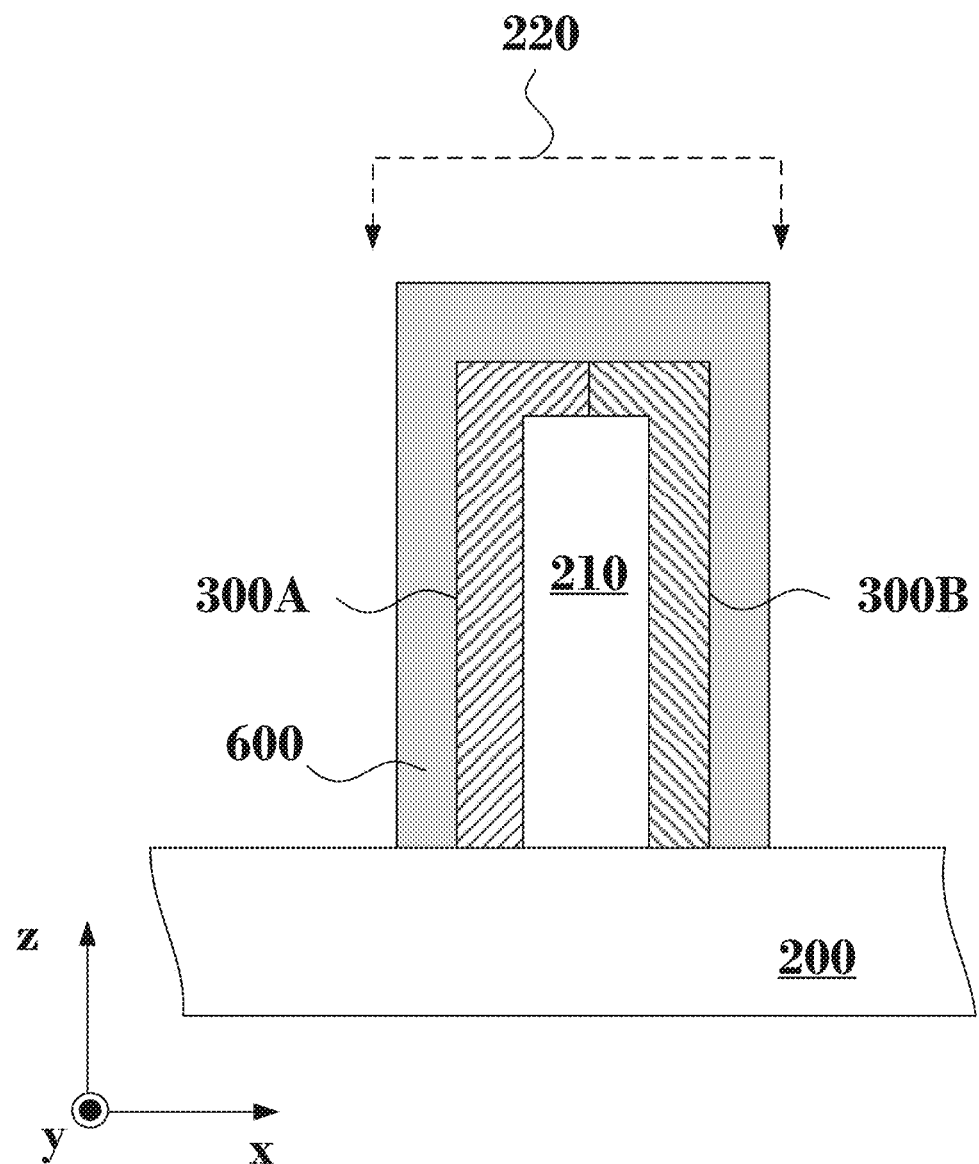
FIG. 7 is a cross-sectional view of gallium nitride fin on a gallium nitride substrate along the x-axis with a spacer on a dielectric layer, in accordance with some embodiments.

In referring to FIG. 1, method 100 continues with operation 140 and the formation of a spacer to cover the sidewall surfaces of gate structure 500 shown in FIG. 5. By way of example and not limitation, the spacer material can include silicon nitride, silicon oxide, or aluminum oxide. Further, the spacer structure can be formed by depositing the spacer material on gate structure 500 and dielectric layers 300A and 300B on fin 210, patterning the spacer material so that the spacer material covers gate structure 500 and a portion of dielectric layers 300A and 300B adjacent to gate structure 500, and by removing the spacer material from the top surface of gate structure 500 with an anisotropic etching process that removes the spacer material faster on horizontal surfaces (e.g., on the top of gate structure 500 and dielectric layers 300A and 300B) and slower on vertical surfaces (e.g., on the sidewalls of gate structure 500). According to some embodiments, a resulting spacer 600 is shown in FIG. 6. FIG. 7 is a cross-sectional view of FIG. 6 along the x-axis. In the example of FIG. 7, gate structure 500 is behind spacer 600 and is not visible. The spacer formation process described above is exemplary and not limiting. Therefore, alternative spacer formation processes can be used and are within the spirit and the scope of this disclosure.

Figure 8:
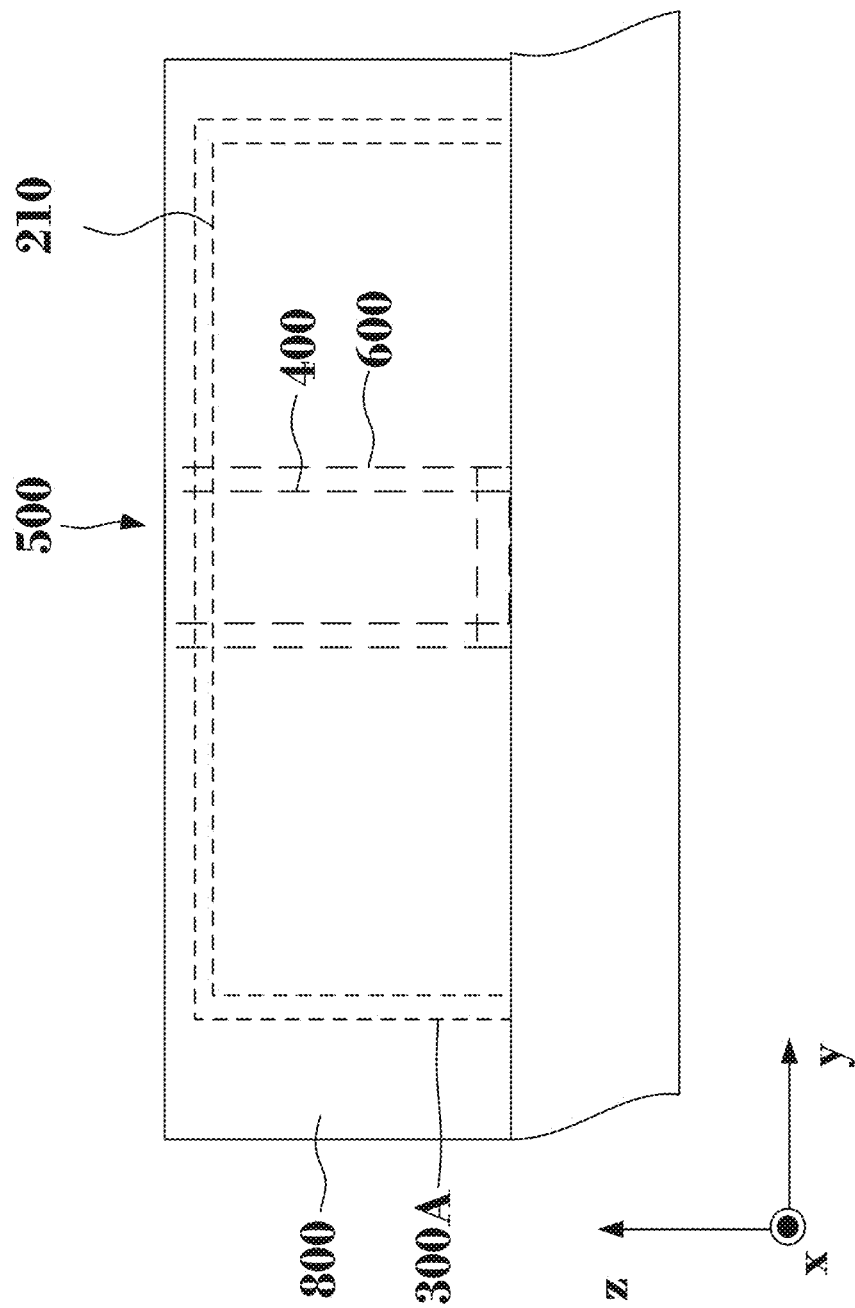
FIG. 8 is a cross-sectional view of a partially-formed field effect transistor structure along the y-axis with a dielectric layer thereon, in accordance with some embodiments.

Referring to FIG. 1, method 100 continues with operation 150 and the formation of contact openings. By way of example and not limitation, contact openings can be formed as follows. A dielectric layer, such as silicon oxide, silicon nitride, aluminum oxide, or combinations thereof can be deposited and subsequently planarized so fin 210 and gate structure 500 are embedded in the dielectric layer. The aforementioned list of materials is not exhaustive and additional materials can be used. Such materials may also include low-k dielectric materials having a dielectric constant lower than about 3.9. According to some embodiments, FIG. 8 is a cross-sectional view of fin 210 along the y-axis after the formation and subsequent planarization of a dielectric layer 800, where the "covered" structures and layers (e.g., fin 210, gate structure 500, dielectric layer 300A, and spacer 600) are represented by dashed lines. By way of example and not limitation, a hard mask layer (not shown in FIG. 8) can be formed on gate structure 500 and spacer 600 to act as a polishing stop layer for the planarization operation of dielectric layer 800. By way of example and not limitation the top surface of dielectric layer 800 can be substantially co-planar with the top surface of gate structure 500. According to some embodiments, dielectric layer 800 is different than the material of spacer 600. For example, if the material of spacer 600 is silicon nitride, the material for dielectric layer 800 is a material other than silicon nitride (e.g., silicon oxide or a low-k dielectric).

Figure 9:
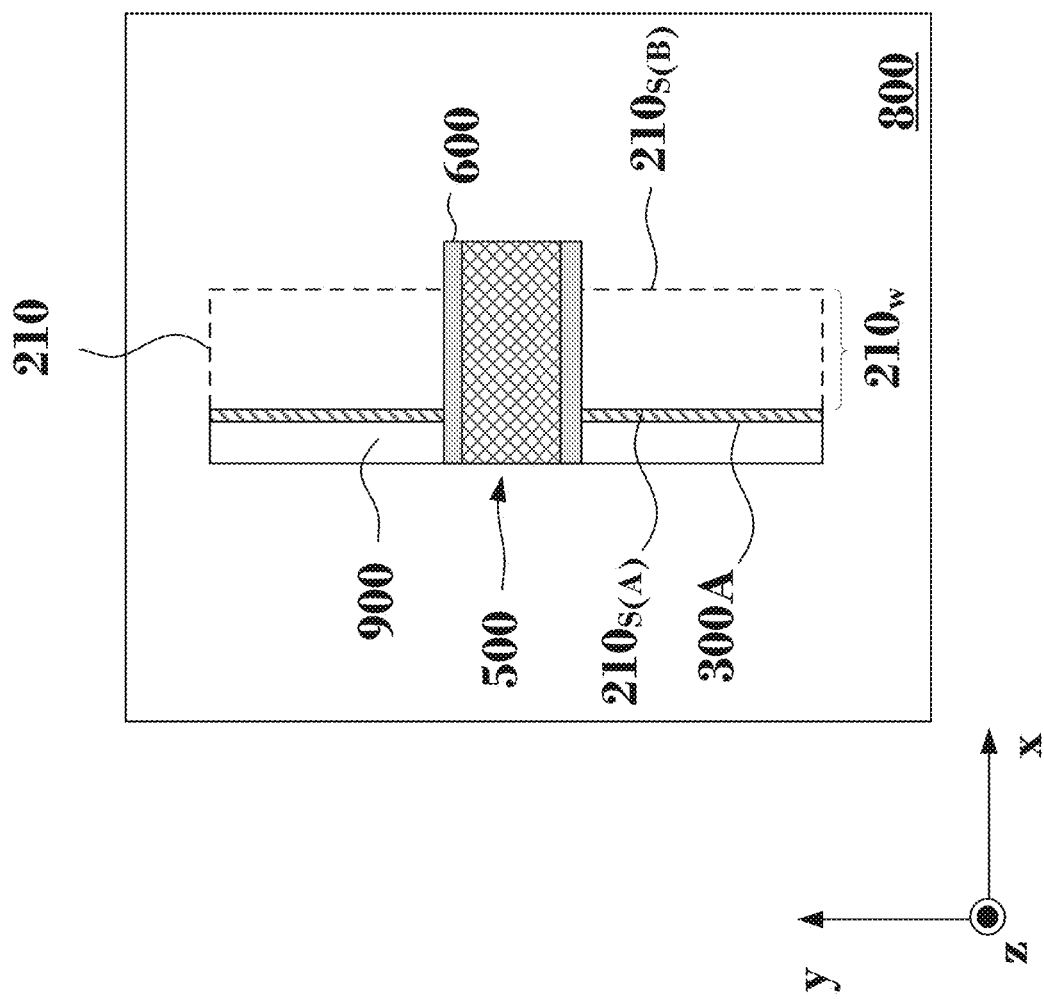
FIG. 9 is a top view of a partially-formed n-type and p-type field effect transistors on a single fin with contact openings for the n-type field effect transistor, in accordance with some embodiments.

In some embodiments, contact openings can be formed in dielectric layer 800 to expose sequentially sidewall surfaces $210_{S(A)}$ and $210_{S(B)}$ of fin 210 to form the source/drain contacts for each nFET and pFET. A contact opening is formed in dielectric layer 800 to expose, for example, dielectric layer 300A on sidewall surface $210_{S(A)}$. The contact opening in dielectric layer 800 can be formed with a dry etching process on a patterned hard mask layer or a patterned photoresist layer. FIG. 9 is a plan view of FIG. 8 after the formation of contact openings 900, which expose dielectric layer 300A on sidewall surface $210_{S(A)}$. The patterned hard mask layer or patterned photoresist layer is not shown in FIG. 9 for simplicity. A dry etching process can be subsequently used to selectively remove the exposed $AlGa_xN$ dielectric layer 300A from sidewall surface $210_{S(A)}$ of fin 210. In some embodiments, the dry etching process does not remove the portion of dielectric layer 300A covered by gate structure 500 and spacer 600.

Figure 10:
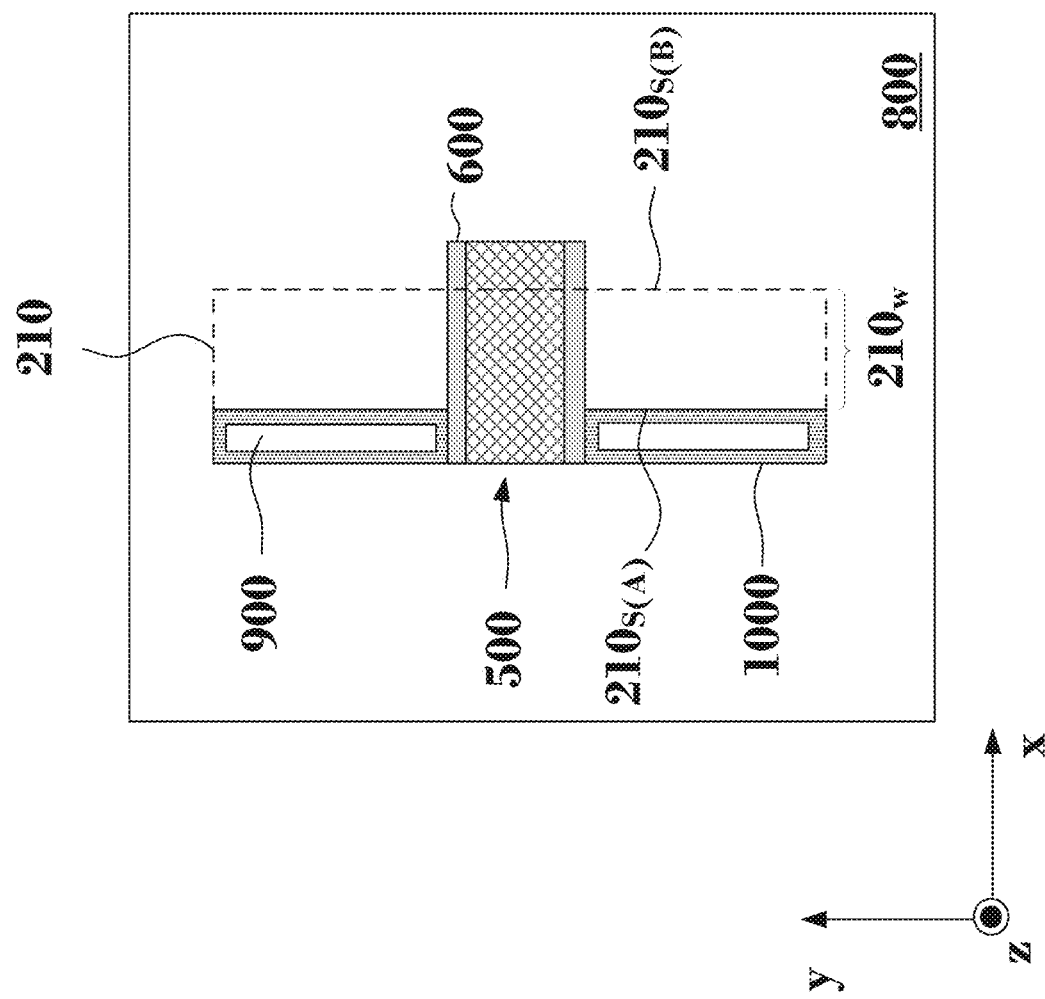
FIG. 10 is a top view of a partially-formed n-type and p-type transistors on a single fin with an n-doped gallium nitride layer in contact openings for the n-type field effect transistor, in accordance with some embodiments.

Once the exposed $AlGa_xN$ dielectric layer 300 is removed, and in referring to FIG. 1 and operation 160, an n-doped GaN layer is deposited. By way of example and not limitation, the deposited n-doped GaN layer is chemically doped with n-type dopants (donors) during its growth. In some embodiments, the n-type dopants in the doped GaN include silicon or germanium and have a doping concentration between about $10^{19}$ atoms/cm$^3$ and about $5\times10^{19}$ atoms/cm$^3$. By way of example and not limitation, n-doped or n-type GaN can be deposited with an MOCVD process at a thickness between about 1 nm and about 5 nm. In some embodiments, n-doped GaN layer 1000 covers the sidewalls of contact openings 900 and the exposed sidewall surface $210_{S(A)}$ of fin 210, as shown in FIG. 10.

Figure 11:
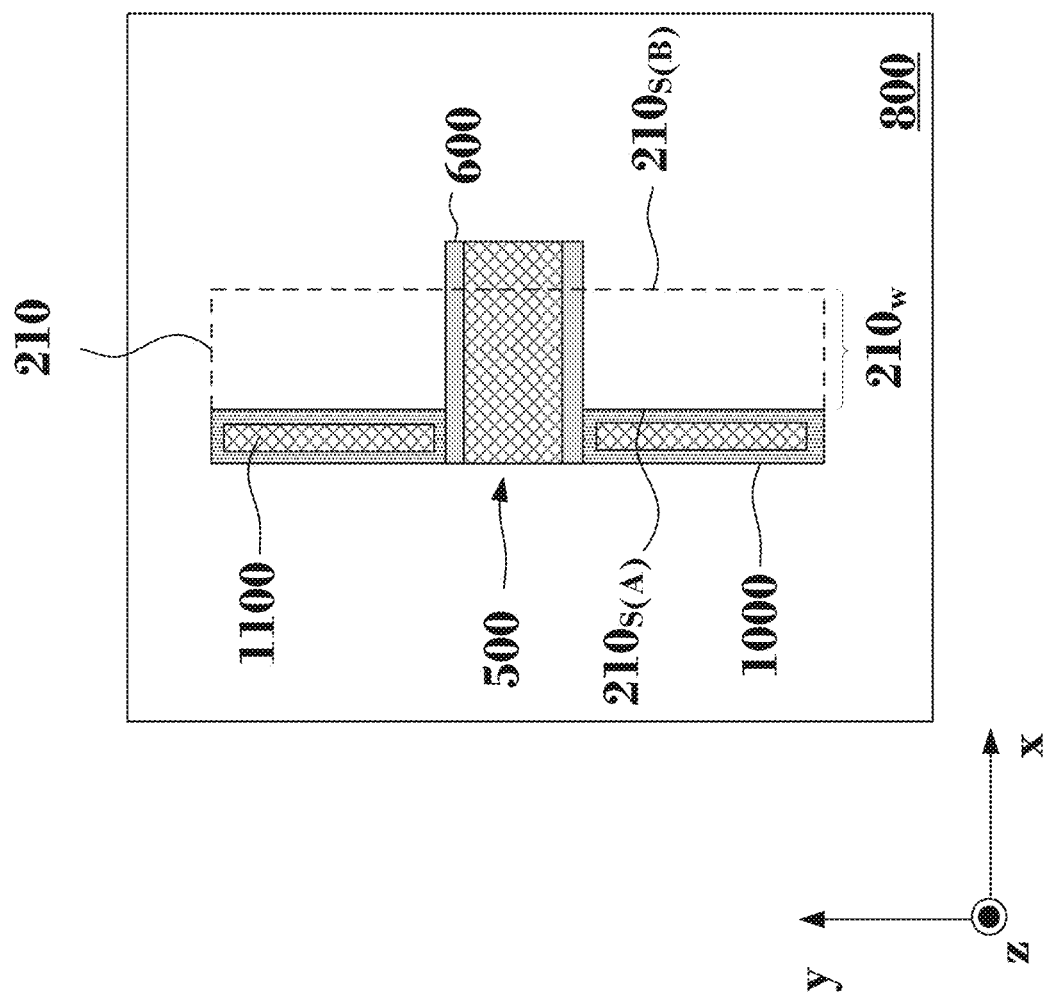
FIG. 11 is a top view of a partially-formed n-type and p-type transistors on a single fin with source/drain contact electrode for the n-type field effect transistor, in accordance with some embodiments.

In referring to FIG. 1 and operation 170, an "n-type contact electrode" can be deposited to contact openings 900. As used herein, the term "n-type contact electrode" refers to the metal used for the nFET, which will be different from the pFET, according to some embodiments. FIG. 11 is a top view of FIG. 10 after operation 160 and the deposition of n-type contact electrode 1100 in contact openings 900. By way of example and not limitation, n-type contact electrode 1100 can be deposited with an ALD process at a thickness between about 1 nm and about 5 nm. In some embodiments, the n-type contact electrode can include (i) a stack of titanium and aluminum or (ii) scandium. However the above-mentioned metals are not limiting and other suitable metals can be used.

In some embodiments, operation 170 concludes the formation of the nFET. Once the contacts for the nFET are formed, a similar process as-described above can be followed to form the contacts for the pFET. For example, contact openings, like contact openings 900 can be formed in dielectric layer 800 to expose dielectric layer 300B on sidewall surface $210_{S(B)}$ of fin 210. Subsequently, the exposed dielectric layer 300B is removed to expose portions of sidewall surface $210_{S(B)}$ of fin 210 not covered by gate structure 500 and spacer 600.

In referring to FIG. 1 and operation 180, a p-type GaN layer is deposited to cover the sidewalls of the contact opening and sidewall surface $210_{S(B)}$ of fin 210. According to some embodiments, the p-doped GaN layer is deposited with an MOCVD process at a thickness between about 1 nm and about 5 nm. As in the case of the n-doped GaN, the p-doped GaN is chemically doped during its growth. According to some embodiments, the p-type dopants (acceptors) for the p-doped GaN include magnesium and have a doping concentration of about $1\times10^{18}$ atoms/cm$^3$. In some embodiments, the p-doped GaN layer covers the sidewalls of the contact opening and the exposed sidewall surface $210_{S(B)}$ of fin 210.

Figure 12:
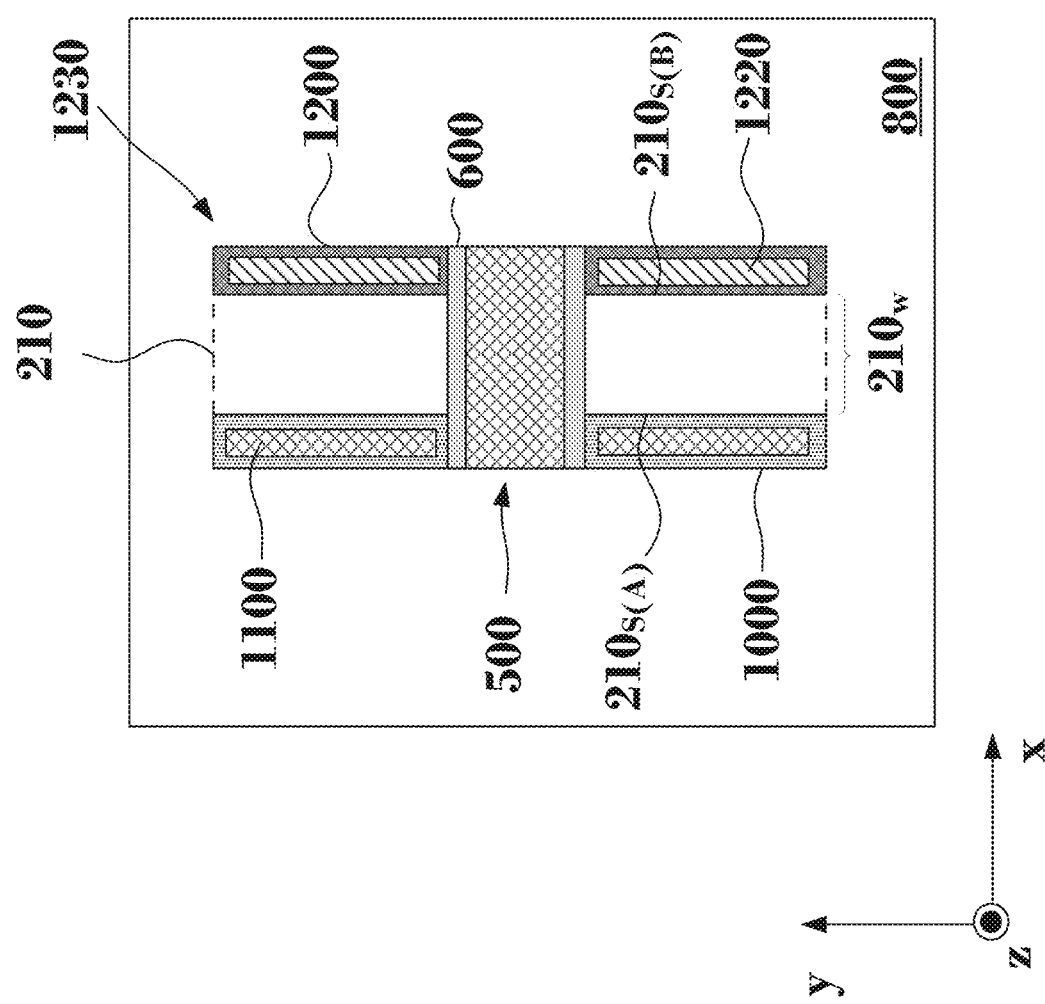
FIG. 12 is a top view of an n-type transistor and a p-type transistor in an inverter configuration, in accordance with some embodiments.

In referring to FIG. 1 and operation 190, a "p-type contact electrode" can be deposited in the contact openings. The term "p-type contact electrode" refers to the metal used for the pFET, which will be different from the nFET, according to some embodiments. FIG. 12 is a top view of FIG. 11 after operations 170 and 180 and the depositions of p-doped GaN 1200 and p-type contact electrode 1220 respectively. By way of example and not limitation, p-type contact electrode 1220 can be deposited with an ALD process at a thickness between about 1 nm and about 5 nm. In some embodiments, the p-type contact electrode includes palladium or platinum. However, the above-mentioned metals are not limiting and other suitable metals can be used. According to some embodiments, operations 170 and 180 of method 100 conclude the formation of the pFET.

According to some embodiments, the nFET and pFET configuration shown in FIG. 12 is an inverter structure 1230 with reduced footprint, where the nFET is formed across sidewall surface $210_{S(A)}$ of fin 210 and the pFET is formed across sidewall surface $210_{S(B)}$ of fin 210. The current flow for the nFET and the pFET of inverter structure 1230 shown in FIG. 12, is along the y-axis confined to the respective surface region of the GaN fin, along sidewall surfaces $210_{S(A)}$ and $210_{S(B)}$. An advantage of fabrication method 100 with the formation of an nFET and a pFET on the same GaN fin 210 is the formation of an inverter with an area density gain of about 30%. Inverter structure 1230 can improve the transistor packing density per unit area in a chip. According to some embodiments, the nFET and pFET of FIG. 12 can operate at a drive voltage range between about 0.7 V and about 1.2 V.

FIG. 13 is a flow chart of a method 1300 for the fabrication of n-type TFETs or p-type TFETs that can operate at low drive voltages of about 0.3 V. The TFETs fabricated with method 1300 can have low power consumption. More specifically, the n-type and p-type TFETs fabricated with method 1300 use an AlN/GaN/InGa$_x$N/GaN (e.g., III-nitride) architecture, with x being equal to or greater than zero (e.g., x≥0). Other fabrication operations may be performed between the various operations of method 1300 and may be omitted merely for clarity. Embodiments of the present disclosure are not limited to method 1300.

In referring to FIG. 13, method 1300 begins with operation 1310 and the formation of a GaN fin on an undoped GaN layer. In some embodiments, operation 1310 is identical to operation 110 of method 100 shown in FIG. 1. Therefore, the resulting GaN fin from operation 1310 is identical to fin 210 of FIGS. 2A and 2B. For example, the GaN fin from operation 1310 shares the same dimensions and crystallographic orientation as GaN fin 210 shown in FIGS. 2A and 2B.

Method 1300 continues with operation 1320 and the growth of an indium gallium nitride (InGa$_x$N, with x≥0) polarization layer on a sidewall surface of the GaN layer. As discussed above, selective deposition or formation of layers on a side of GaN fin 210 can be achieved by covering the sidewall surface of the fin where deposition is not desired and leaving exposed the sidewall surface of the fin where deposition is desired.

In some embodiments, localized polarization charges are present at the interface between the InGa$_x$N polarization layer and GaN fin 210—for example, similar to the localized polarization charges at the interface between the AlGa$_x$N dielectric layer and GaN fin 210 discussed earlier. However, the localized interface polarization charge densities in this case may be different from the case of the AlGa$_x$N dielectric layer. By way of example and not limitation, the absolute values of the localized interface polarization charge density at the InGa$_x$N/GaN interface can be between about $5\times10^{12}/\text{cm}^2$ and about $5\times10^{14}/\text{cm}^2$. In referring to FIG. 2B, and for an n-type (n-channel) TFET, the InGa$_x$N polarization layer is deposited on sidewall surface $210_{S(A)}$, which is parallel to the GaN polarization (0001) plane. Conversely, for a p-type (p-channel) TFET, the InGa$_x$N polarization layer is deposited on sidewall surface $210_{S(B)}$, which is parallel to the polarization GaN (000$\bar{1}$) plane. Therefore, depending on the type of FET, the InGa$_x$N polarization layer can be formed on sidewall surface $210_{S(A)}$ or $210_{S(B)}$. By way of example and not limitation, the InGa$_x$N layer is grown with an MOCVD process at a thickness between about 1 nm and about 3 nm. In some embodiments, the localized polarization charge density at the interface between GaN and InGa$_x$N can be modulated through the thickness and the amount of Ga "x" of InGa$_x$N dielectric layers 1400.

By way of example and not limitation, FIGS. 14 through 17 will be used, along with the operations of method 1300, to describe the formation of an n-type TFET. The operation of method 1300 can be also used to form p-type TEFTs.

Figure 14:
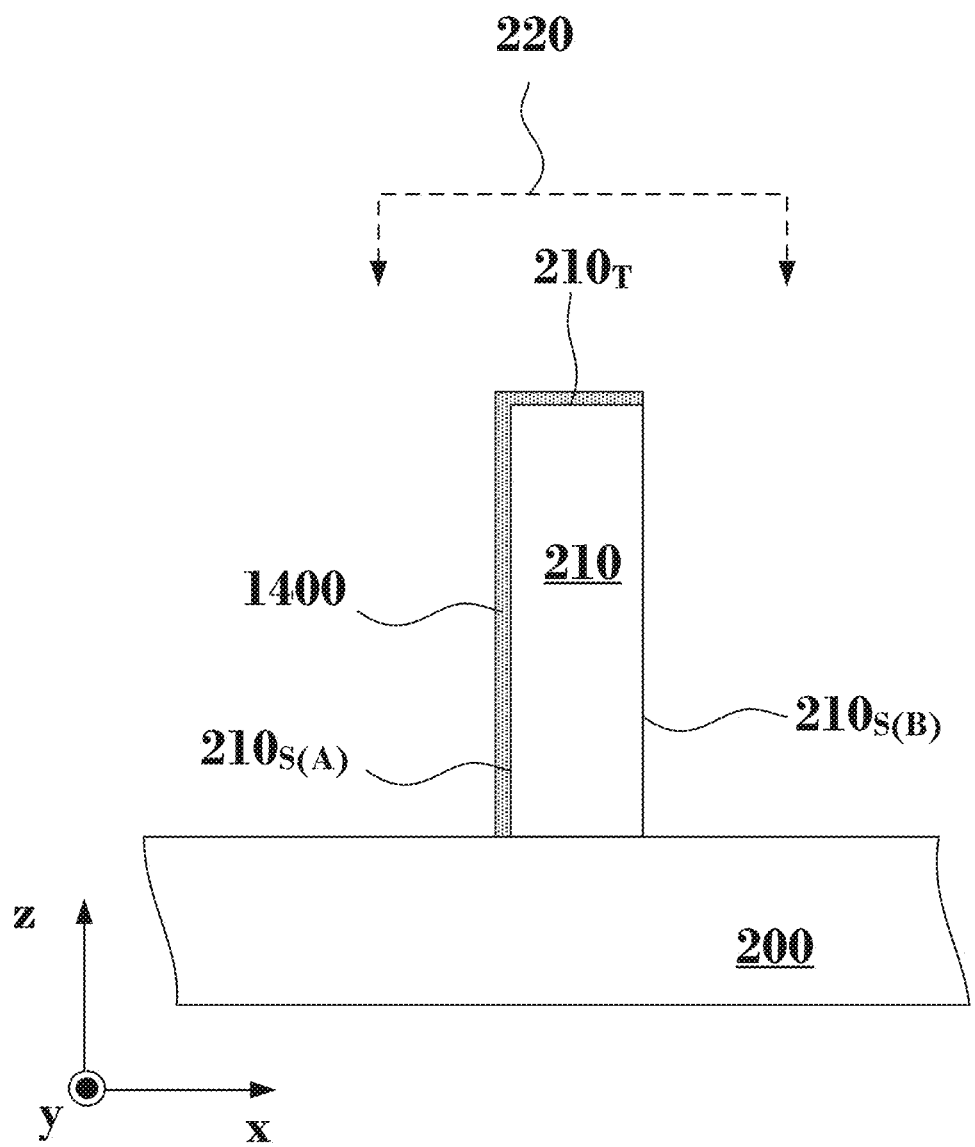
FIG. 14 is a cross-sectional view of a gallium nitride fin on a gallium nitride layer along the x-axis after a deposition of an indium nitride polarization layer, in accordance with some embodiments.

FIG. 14 shows fin 210 of FIG. 2B after the deposition of InGa$_x$N polarization layer 1400 on sidewall surface $210_{S(A)}$, which is parallel to the GaN polarization (0001) plane. As discussed above, a negative localized interface polarization charge is present on sidewall surface $210_{S(A)}$—e.g., at the interface between InGa$_x$N polarization layer 1400 and GaN fin 210. In some embodiments, top surface $210_T$ is parallel to the m-plane (1$\bar{1}$00), which is a non-polar plane and, therefore, no polarization charge will be present on top surface $210_T$.

In some embodiments, if a p-type TFET was desired, the InGa$_x$N polarization layer can be deposited on sidewall surface $210_{S(B)}$, instead of sidewall surface $210_{S(A)}$. In some embodiments, the p-type TFET structure is a mirror image of the n-type TFET structure along the z-axis.

In referring to FIG. 13, method 1300 continues with operation 1330 and the growth of a doped GaN layer on the InGa$_x$N polarization layer. In some embodiments, the dopant selection (n-type or p-type) for the GaN layer is based on the type of TFET (e.g., nFET or pFET). For example, in the case of the n-type TFET of FIG. 14, the GaN layer is doped with n-type dopants. In some embodiments, the doped GaN layer functions as the "drain" and the GaN fin functions as the "source" for the formed TFET.

By way of example and not limitation, the deposited GaN layer is chemically doped with n-type dopants (donors) or p-type dopants (acceptors) during its growth. In some embodiments, the n-doped GaN layer is formed using silicon or germanium dopants with an activated doping concentration between about $10^{19}$ electrons/cm$^3$ and about $5\times10^{19}$ electrons/cm$^3$. Similarly, a p-doped GaN layer is formed using magnesium dopants with an activated doping concentration of about $1\times10^{18}$ holes/cm$^3$. The aforementioned activated doping concentrations for n- and p-doped GaN layers are exemplary. Therefore, higher activated doping concentrations (e.g., higher than about $5\times10^{19}$ electrons/cm$^3$ and higher than about $1\times10^{18}$ holes/cm$^3$) are also desirable and within the spirit and the scope of this disclosure. By way of example and not limitation, both n-doped and p-doped GaN can be deposited with an MOCVD process at a thickness between about 2 nm and about 5 nm.

Figure 15:
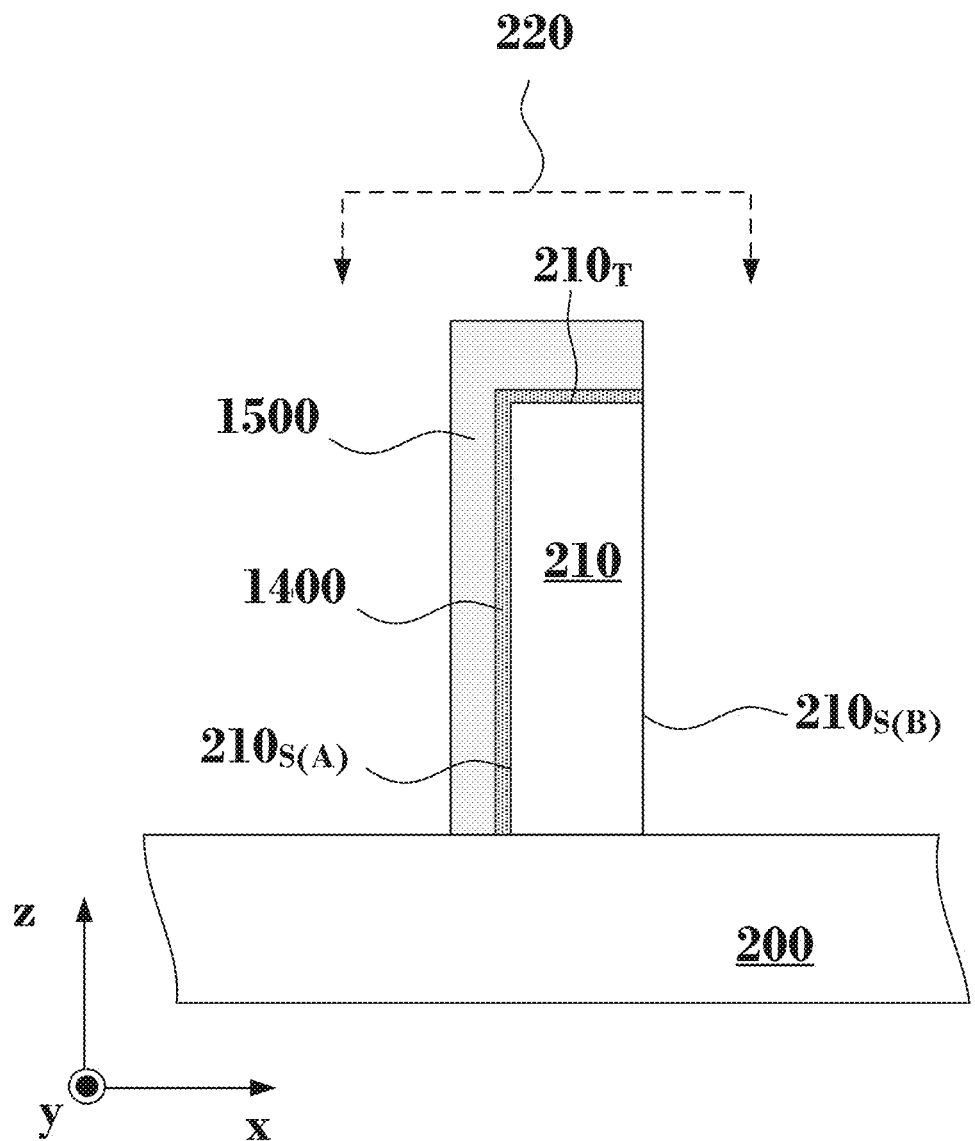
FIG. 15 is a cross-sectional view of a gallium nitride fin on a gallium nitride layer along the x-axis after deposition of an n-doped gallium nitride layer, in accordance with some embodiments.

By way of example and not limitation, FIG. 15 shows FIG. 14 after the deposition of an n-type doped GaN layer 1500 on InGa$_x$N polarization layer 1400. During the deposition or growth of n-type doped GaN layer 1500 and InGa$_x$N polarization layer 1400, sidewall surface $210_{S(B)}$ remains covered by a hard mask (not shown in FIG. 15), so there is no deposition on sidewall surface $210_{S(B)}$ of GaN fin 210. In the case of a p-type TFET formation, the doped GaN layer can be doped with p-type dopants and it can be deposited on sidewall surface $210_{S(B)}$.

In referring to FIG. 13, method 1300 continues with operation 1340, where an AlN dielectric layer is deposited on both sidewall surfaces of GaN fin 210 (e.g., sidewall surface $210_{S(A)}$ and sidewall surface $210_{S(B)}$). For this operation, sidewall surface $210_{S(B)}$ is exposed so that the AlN dielectric layer can also be deposited on sidewall surface $210_{S(B)}$. By way of example and not limitation, a sacrificial hard mask layer or a sacrificial capping layer can be deposited on doped GaN layer 1500 on top surface $210_T$ to prevent the deposition of the AlN dielectric layer on doped GaN layer 1500 on top surface $210_T$ of fin 210.

Similarly, in the case of a p-type TFET formation, sidewall surface $210_{S(A)}$ can be exposed so that the AlN dielectric layer can be deposited on both sidewall surfaces of GaN fin 210.

Figure 16:
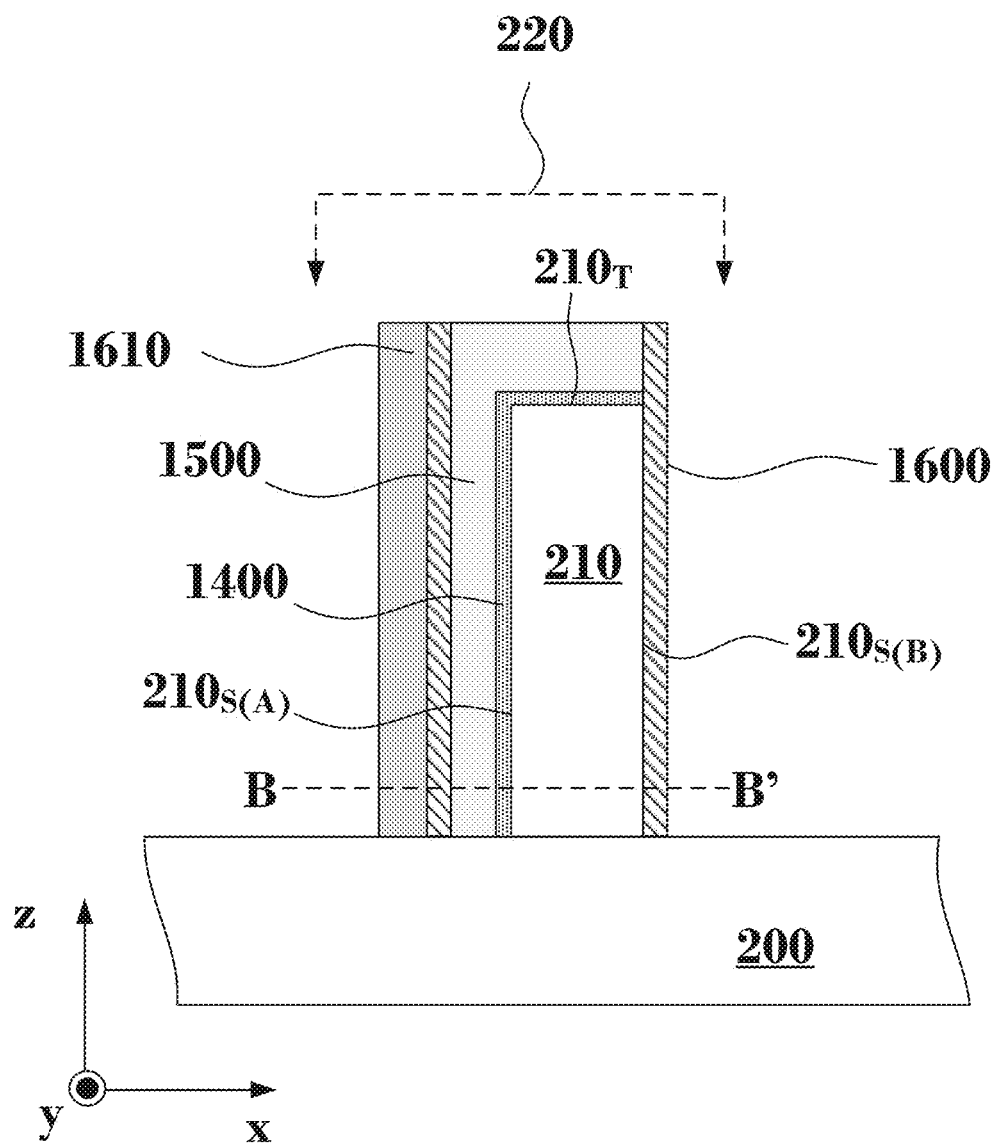
FIG. 16 is a cross-sectional view of an n-type tunnel field effect transistor along the x-axis, in accordance with some embodiments.

In referring to FIG. 13, method 1300 continues with operation 1350 and the deposition of a gate electrode layer on the AlN dielectric layer and on the InGa$_x$N polarization layer. In other words, the gate electrode layer is selectively deposited on a sidewall surface of GaN fin 210. This can be achieved, for example, by covering the AlN dielectric layer of the sidewall surface where deposition of the gate layer is not desired with a hard mask. For example, in the n-type TFET of FIG. 15, the gate electrode can be deposited on sidewall surface $210_{S(A)}$. FIG. 16 shows the resulting n-type TFET structure after operations 1340 and 1350 and the deposition of an AlN dielectric layer 1600 on both sidewall surfaces $210_{S(A)}$ and $210_{S(B)}$ of GaN fin 210 and the deposition of gate electrode layer 1610 on AlN dielectric layer 1600 on InGa$_x$N polarization layer 1400 and sidewall surface $210_{S(A)}$. In FIG. 16, the hard mask layer on sidewall surface $210_{S(B)}$ is not shown for simplicity.

Figure 17:
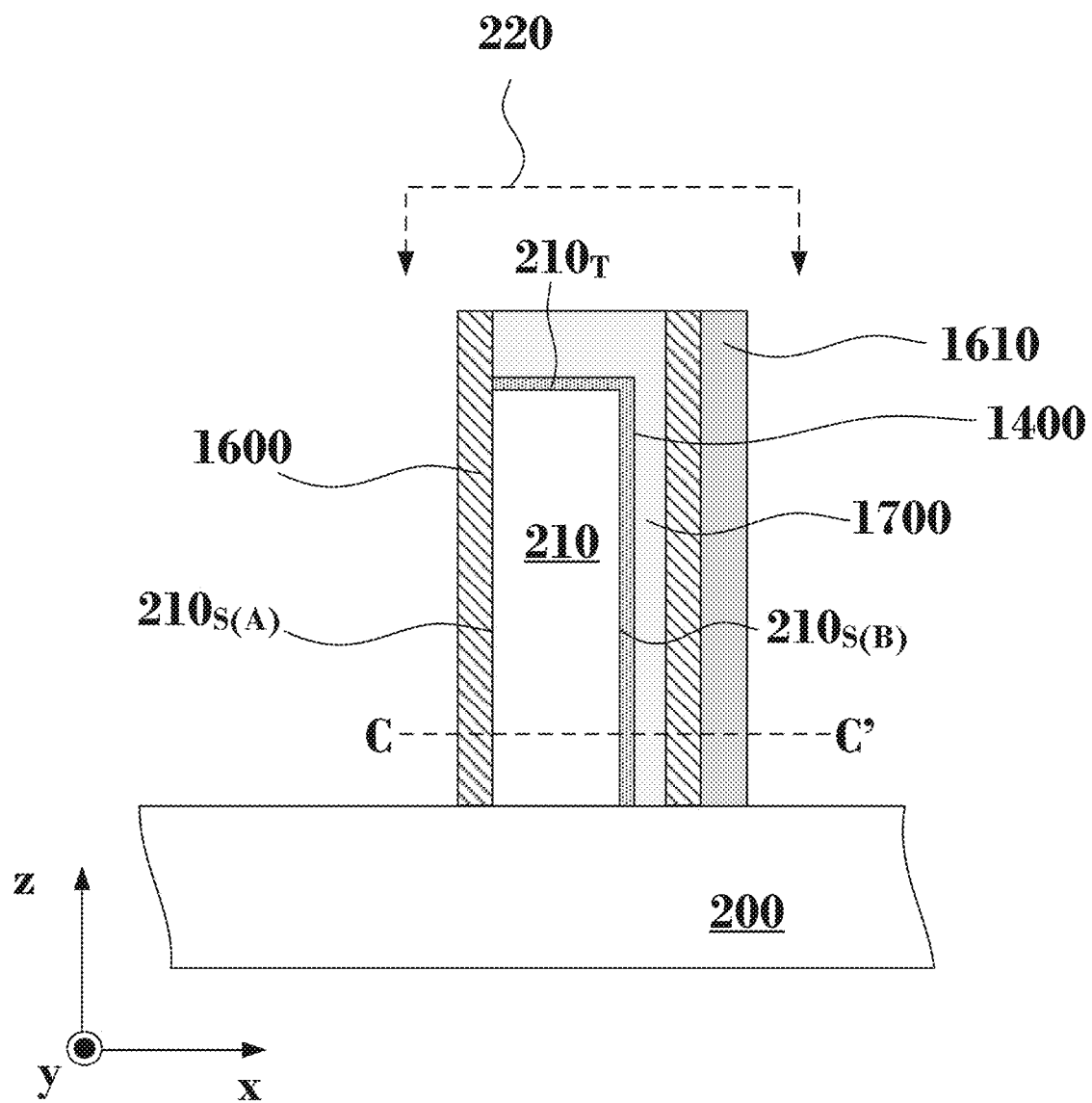
FIG. 17 is a cross-sectional view of a p-type tunnel field effect transistor along the x-axis, in accordance with some embodiments.

FIG. 17 is a cross sectional view of a p-type TFET structure with a p-doped GaN layer 1700, according to some embodiments. The p-type (p-channel) TFET structure shown in FIG. 17 can be a mirror structure of the n-type (n-channel) TFET show in FIG. 16.

In some embodiments, and referring to FIG. 16, the stack that includes gate electrode layer 1610, AlN dielectric layer 1600, n-doped GaN layer 1500, and InGa$_x$N polarization layer 1400 on sidewall surface $210_{S(A)}$ are patterned to form a structure on, for example, a middle portion of fin 210. During the patterning process, gate electrode layer 1610, AlN dielectric layer 1600, n-doped GaN layer 1500, and InGa$_x$N polarization layer 1400 are removed from other portions of fin 210, and sidewall surface $210_{S(A)}$ of those portions is exposed. In some embodiments, and during the aforementioned patterning process, AlN dielectric layer 1600 is not removed from sidewall surface $210_{S(B)}$.

Figure 18:
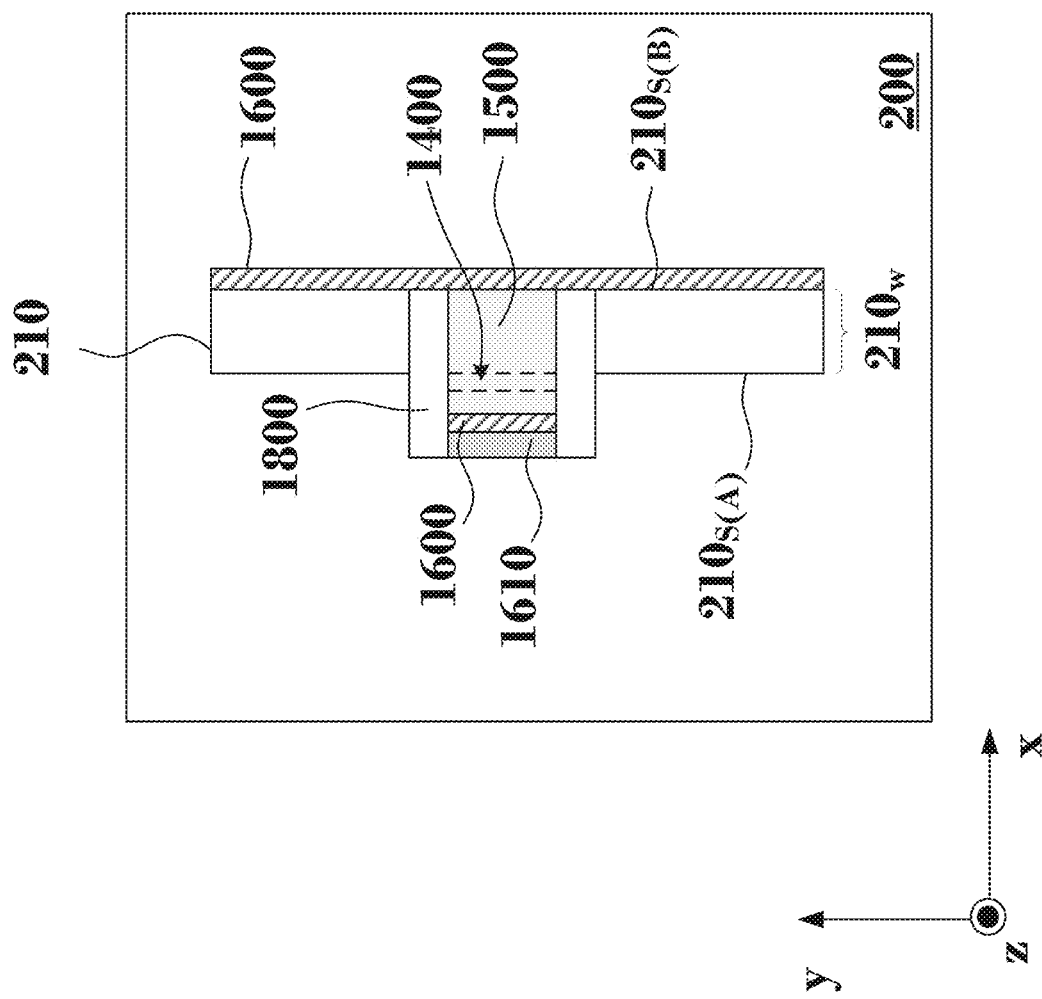
FIG. 18 is a top view of an n-type tunnel field effect transistor with spacers, in accordance with some embodiments.

By way of example and not limitation, FIG. 18 is a top view of fin 210 after the patterning process described above. In the view FIG. 18, InGa$_x$N polarization layer 1400 is covered by n-doped GaN layer 1500 [this layer is not correctly indicated in FIG. 18] and is represented with a dotted line.

Similarly to n-type TFET shown in FIG. 18, the stack of the p-type TFET structure shown in FIG. 17 with gate electrode layer 1610, AlN dielectric layer 1600, p-doped GaN layer 1700, and InGa$_x$N polarization layer 1400 on sidewall surface $210_{S(B)}$ is also patterned to form a structure on, for example, a middle portion of fin 210. During the patterning process, gate layer 1610, AlN dielectric layer 1600, p-doped GaN layer 1700, and InGa$_x$N polarization layer 1400 are removed from other portions of fin 210, and sidewall surface $210_{S(B)}$ of those portions is exposed. In some embodiments, AlN dielectric layer 1600 on sidewall surface $210_{S(A)}$ is not removed during the aforementioned patterning process.

In some embodiments, a spacer is formed on the sidewalls of the patterned structure that includes the gate electrode layer, the AlN dielectric layer, the doped GaN layer, and the InGa$_x$N polarization layer. The spacer formation is similar to the formation of spacer 600 shown in FIG. 6, which has been described above for operation 140 of method 100 shown in FIG. 1. By way of example and not limitation, FIG. 18 includes spacers 1800 that cover the sidewall surfaces of the patterned gate layer 1610, AlN dielectric layer 1600, doped GaN layer 1500, and InGa$_x$N polarization layer 1400 stack. In some embodiments, spacers can be formed on n-type and p-type TFETs based on the same fabrication operations described for operation 140 of method 100 shown in FIG. 1.

In referring to FIG. 13, TFET fabrication method 1300 continues with operation 1360 and the formation of source and drain contacts for the n-type TFET or the p-type TFET. In some embodiments, the source contacts are formed on the side walls of fin 210 with a process is similar to operations 150 through 180 of method 100 shown in FIG. 1. However, in the case of TFETs, the n-doped GaN layer of operation 160 and the p-doped GaN layer of operation 180 is replaced in one embodiment with an InGa$_x$N polarization layer, which can be common for both n-type TFETs and p-type TFETs. Respectively, the drain contacts are formed on a top surface of n-GaN layer 1500 for the nTFET and on a top surface of p-GaN layer 1700 for the pTFET.

By way of example and not limitation, the source contact formation process will be provided for the n-type TFET of FIG. 18. However, the source contact formation process for p-type TFETs is similar to the source contact formation process for the n-type TFET of FIG. 18, with the exception of an n-contact electrode being used instead of the p-contact electrode.

Figure 19:
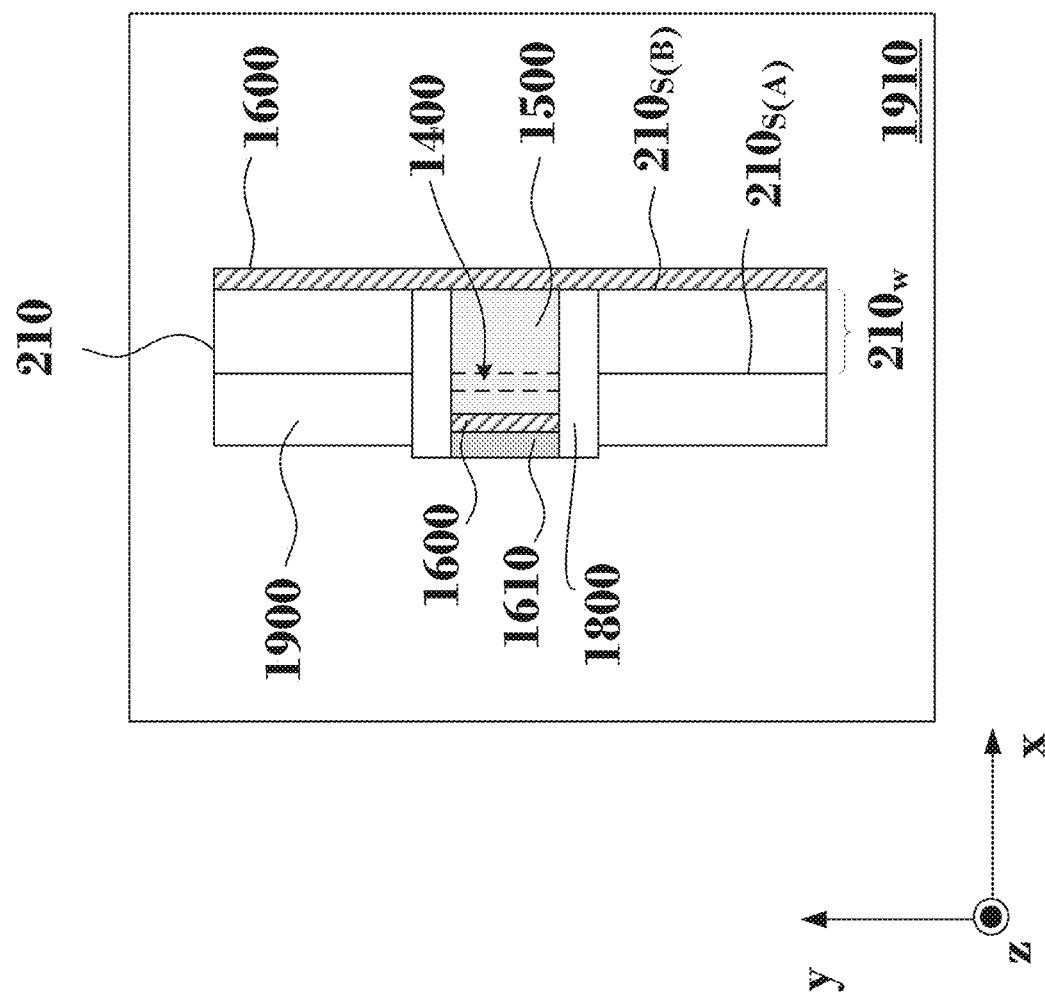
FIG. 19 is a top view of an n-type tunnel field effect transistor with contact openings, in accordance with some embodiments.

According to operation 1360 of FIG. 13, source contact openings can be formed in a dielectric layer deposited on the n-type TFET structure of FIG. 18. By way of example and not limitation, the dielectric layer can be similar to dielectric layer 800 shown in FIGS. 8-12 and can be deposited over substrate 200 so that its top surface is substantially co-planar with the top surface of gate layer 1610. In some embodiments, the deposited dielectric layer completely covers gate layer 1610. Further, the dielectric layer can be different than the material of spacer 1800. For example, if the material of spacer 1800 is silicon nitride, the material for the dielectric layer is other than silicon nitride (e.g., silicon oxide or a low-k dielectric). The source contact openings in the dielectric layer expose sidewall surface $210_{S(A)}$ of fin 210. The source contact openings in the dielectric layer can be formed, for example, with a dry etching process through an etching mask, such as a patterned hard mask or a patterned photoresist. FIG. 19 is a view of FIG. 18 after the formation of source contact openings 1900 in a dielectric layer 1910, which expose dielectric sidewall surface $210_{S(A)}$, as discussed above. In some embodiments, source contact openings 1900 are formed adjacent to spacers 1800, as shown in FIG. 19.

In some embodiments, another InN polarization layer is grown in openings 1900. The InN polarization layer covers the sidewall surfaces of openings 1900 and the exposed sidewall surface $210_{S(A)}$ of GaN fin 210. Next, a p-type contact electrode is deposited into source contact opening

Figure 20:
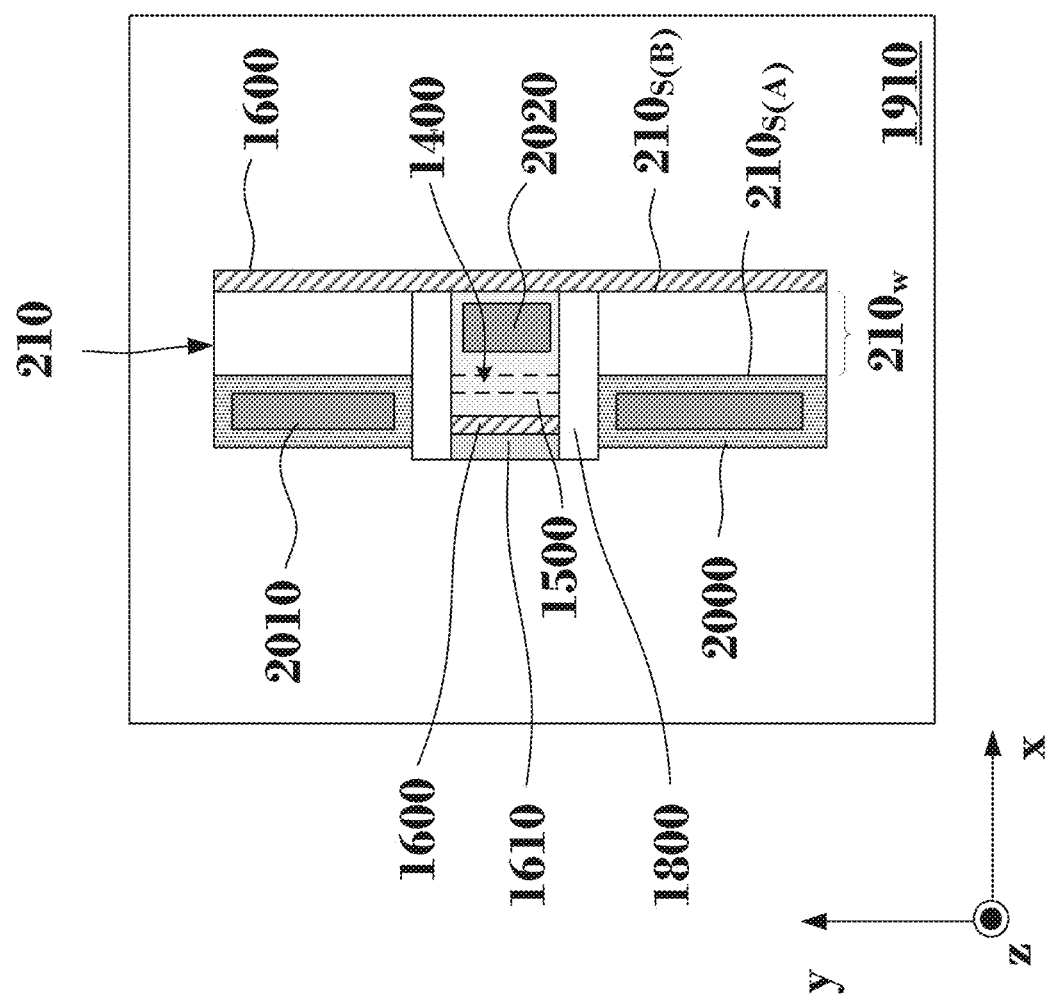
FIG. 20 is a top view of an n-type tunnel field effect transistor with contacts, in accordance with some embodiments.

1900 to form the source metal contact. In a p-type TFET, an n-type source contact electrode is deposited instead of the p-type source contact electrode. FIG. 20 is the top view shown in FIG. 19 after the deposition of InN polarization layer 2000 and p-type contact electrode 2010 in contact openings 1900.

By way of example and not limitation, n-type and p-type contact electrodes can be deposited with an ALD process at a thickness between about 2 nm and about 5 nm. In some embodiments, the n-type contact electrode includes a stack of (i) titanium and aluminum or (ii) scandium, and the p-type contact electrode includes palladium or platinum. The above-mentioned metals are exemplary and not limiting and other suitable metals are possible.

As discussed above, the p-type TFET structures can be mirror structures of n-type TFETs along the z-axis and their fabrication can also be described with method 1300. In some embodiments, n-type and p-type TFETs can be formed concurrently with the nFETs and pFETs of the inverter structure shown in FIG. 12. Consequently, the integration of both FETs and TFETs, as described herein, is possible in the same circuit. Further, the TFETs fabricated with method 1300 can operate at low drive voltages of about 0.3 V and therefore have reduced power consumption and heat generation.

As discussed above, the drain contacts are formed on a top surface of n-GaN layer 1500 for the nTFET and on a top surface of p-GaN layer 1700 for the pTFET. For example and referring to FIG. 20, drain contact 2020 can be formed on a top surface of n-GaN layer 1500. By way of example and not limitation, the formation of drain contact 2020 can be described as follows. A drain contact opening is formed in dielectric layer 1910, for example, with a dry etching process through an etching mask, such as a patterned hard mask or a patterned photoresist, to expose a top surface of n-GaN layer 1500. Subsequently, an n-type contact electrode can be deposited in the drain opening to form drain contact 2020, as shown in FIG. 20. If the top surface of dielectric layer 1910 is coplanar with the top surface of GaN layer 1500, a second dielectric can be deposited over dielectric layer 1910 so that the drain opening can be formed on the second dielectric layer. Drain contacts for pTFETs can be formed in a similar manner using a p-type contact electrode as opposed to an n-type contact electrode. As discussed above, n-type and p-type contact electrodes can be deposited with an ALD process at a thickness between about 2 nm and about 5 nm. In some embodiments, the n-type contact electrode includes a stack of (i) titanium and aluminum or (ii) scandium, and the p-type contact electrode includes palladium or platinum. The above-mentioned metals are exemplary and not limiting and other suitable metals are possible.

Figure 21:
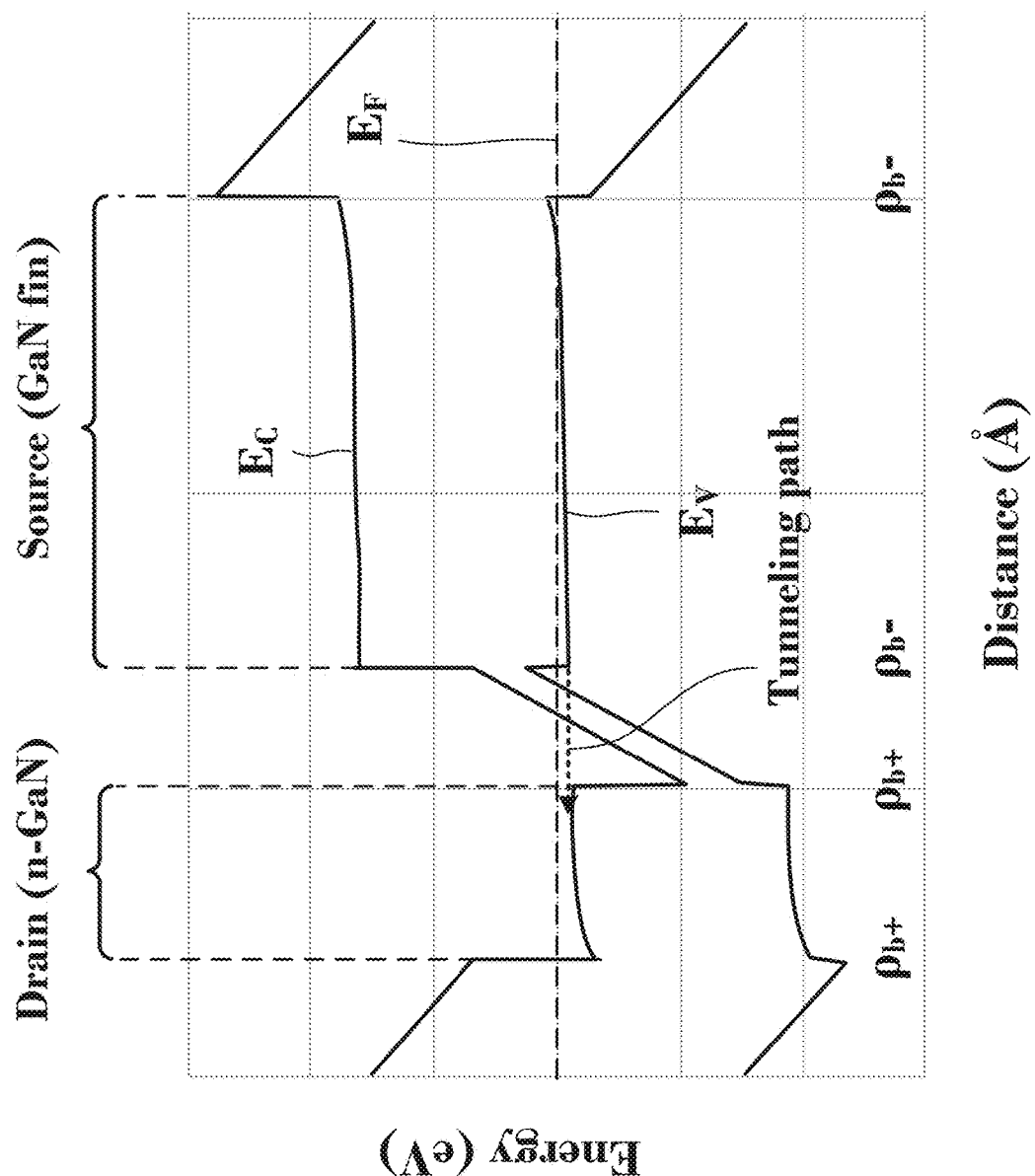
FIGS. 21 and 22 are simulated energy band diagrams for respective n-type and p-type TFET structures during an ON state, in accordance with some embodiments.
Figure 22:
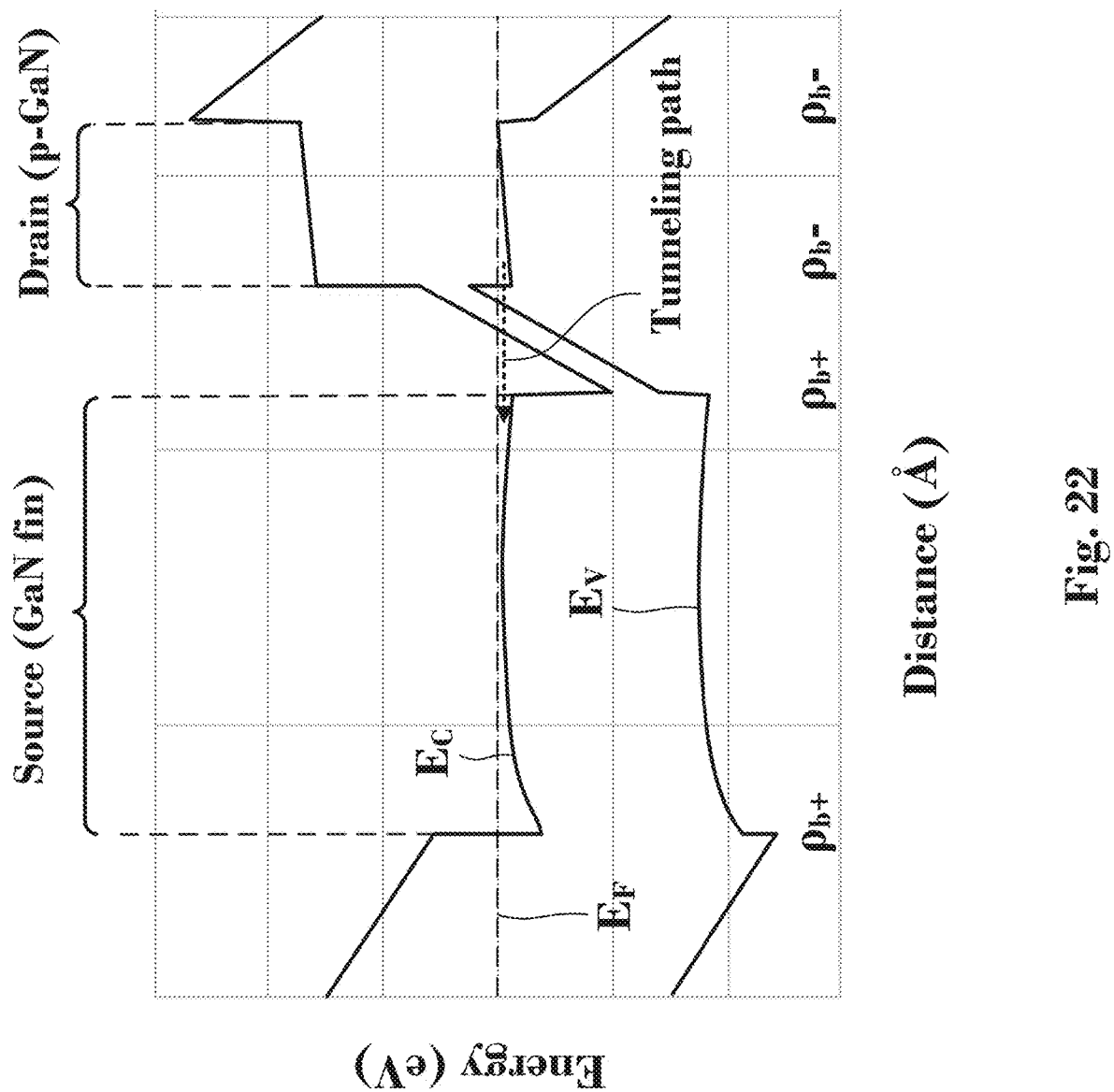

According to some embodiments, FIG. 21 is a simulated energy band diagram of an nTFET during an ON state, and FIG. 22 is a simulated energy band diagram of a pTFET during an ON state. By way of example and not limitation, FIG. 21 can be the energy band diagram of the nTFET shown in FIG. 16 across line BB', and FIG. 22 can be the pTFET structure shown in FIG. 17 across line CC'. Localized interface polarization charges $\rho_{b+}$ and $\rho_{b-}$ are also shown on respective interfaces between the GaN fin, the InGa$_x$N polarization layer, and the doped GaN layer.

For band-to-band tunneling to occur during an ON state, an electron in the valence band ($E_v$) of the source in FIG. 21 has to tunnel to the conduction band ($E_C$) of the drain without the assistance of traps (e.g., intermediate energy levels). Accordingly, for band-to-band tunneling to occur, an electron in the valence band ($E_V$) of the drain in FIG. 22 has to tunnel to the conduction band ($E_C$) of the source in FIG. 22 without the assistance of traps (e.g., intermediate energy levels).

The embodiments described herein are directed to integrated fabrication processes for FET and TFET fin-based structures using group III-nitride materials, such as gallium nitride, aluminum nitride, aluminum gallium nitride, and indium nitride. The resulting FETs can be used for high drive voltage operations (e.g., between about 0.6 V and about 1.2 V), and the TFET structures can be used for low drive voltage operations (e.g., about 0.3 V). Both FET and TFET structures are fabricated with a fin-based architecture that offers: (i) mechanical stability suitable for ultra-small devices, (ii) seamless integration between the FETs and TFETs, and (iii) increased device density. According to some embodiments, the fabricated FETs and TFETs feature polar interfaces, which provide localized interface polarization charge planes. With the use of polar and non-polar interfaces, n-type and p-type FETs can be fabricated on a single fin, which can further reduce the footprint of the resulting FET structures and eliminate the use of implant doping. According to some embodiments, an undoped, etched gallium nitride fin is the starting point for both FET and TFET structures. Further, the use of a single crystal AlN or AlGa$_x$N high-k dielectric reduces the interface state density ($D_{it}$) and can improve off-current limitations.

In some embodiments, a semiconductor structure includes a fin with a non-polar top surface and two opposing first and second polar sidewall surfaces. The semiconductor structure further includes a first polar layer on the first polar sidewall surface, a second polar layer on the second polar sidewall surface, and a gate electrode layer on the first and second polar layers.

In some embodiments, a semiconductor structure includes a substrate from an undoped semiconductor material and a fin disposed on the substrate. The fin includes a non-polar top surface and two opposing first and second polar sidewall surfaces and is made of the undoped semiconductor material. The semiconductor structure further includes a polarization layer on the first polar sidewall surface, a doped semiconductor layer on the polarization layer, a dielectric layer on the doped semiconductor layer and on the second polar sidewall surface, and a gate electrode layer on the dielectric layer and the first polarized sidewall surface.

In some embodiments, a circuit includes a finFET inverter structure and a TFET. The finFET inverter structure includes a first fin with two opposing first and second polar sidewall surfaces; a first dielectric layer on the first polar sidewall surface of the first fin; a second dielectric layer on the second polar sidewall surface of the first fin; and a gate electrode material on the first and second dielectric layers. The TFET includes a second fin with two opposing first and second polar sidewall surfaces, a polarization layer on the first polar sidewall surface of the second fin, a doped semiconductor layer on the polarization layer, a third dielectric layer on the doped semiconductor layer and the second polar sidewall surface of the second fin, and the gate electrode material on the third dielectric layer that is on the first polar sidewall surface of the second fin.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin with a first and second polar sidewall surfaces;
    growing a first and second polar layers on the first and second polar sidewall surfaces, respectively;
    growing first and second doped semiconductor material layers on the first and second polar sidewall surfaces, respectively, not covered by the first and second polar layers;
    forming a first opening in the first doped semiconductor material layer and a second opening in the first doped semiconductor material layer; and
    depositing a first electrode and a second electrode in the first opening and the second opening, respectively.

2. The method of claim 1, wherein the first and second polar sidewall surfaces comprise localized interface polarization charges with opposite polarities.

3. The method of claim 1, wherein each of the first and second polar layers comprises aluminum nitride or aluminum gallium nitride with different mole fraction ratios.

4. The method of claim 1, wherein the first and second polar layers have different thicknesses.

5. The method of claim 1, wherein the first and second polar layers have a thickness between about 1 nm and about 3 nm.

6. The method of claim 1, wherein the fin comprises undoped gallium nitride, a height between about 30 nm and about 50 nm, and a width between about 8 nm and about 10 nm.

7. The method of claim 1, further comprising:
    forming a gate electrode layer on the first and second polar layers, wherein the first electrode and the second electrode are located at two opposite sides of the gate electrode layer along the first polar sidewall surface.

8. The method of claim 7, wherein the first polar sidewall surface, the first polar layer, and the gate electrode layer on the first polar layer form a first type of field effect transistor, and wherein the second polar sidewall surface, the second polar layer, and the gate electrode layer on the second polar layer form a second type of field effect transistor different from the first type of field effect transistor.

9. The method of claim 8, wherein the first type of field effect transistor is n-type and the second type of field effect transistor is p-type.

10. The method of claim 1, further comprising:
    depositing a third electrode on the second doped semiconductor material layer, wherein the first doped semiconductor material layer is different from the second doped semiconductor material layer.

11. The method of claim 10, wherein the first doped semiconductor material layer comprises n-doped gallium nitride and the second doped semiconductor material layer comprises p-doped gallium nitride.

12. A method, comprising:
    forming a fin on a substrate comprising an undoped semiconductor material, wherein the fin comprises a top surface, first and second polar sidewall surfaces, and the undoped semiconductor material;
    growing a polarization layer on the first polar sidewall surface;
    growing a doped semiconductor layer on the polarization layer;
    forming a dielectric layer on the doped semiconductor layer and on the second polar sidewall surface; and
    forming a gate electrode layer on the dielectric layer and the first polar sidewall surface.

13. The method of claim 12, wherein the undoped semiconductor material comprises gallium nitride, and wherein the first polar sidewall surface is parallel to a (0001) plane, the second polar sidewall surface is parallel to a (000$\bar{1}$) plane, and the top surface is parallel to a (1$\bar{1}$00) plane.

14. The method of claim 12, wherein the undoped semiconductor material comprises gallium nitride, and wherein the first polar sidewall surface is parallel to a (000$\bar{1}$) plane, the second polar sidewall surface is parallel to a (0001) plane, and the top surface is parallel to a (1$\bar{1}$00) plane.

15. The method of claim 12, wherein the polarization layer comprises indium nitride or indium gallium nitride and the doped semiconductor layer comprises n-doped gallium nitride or p-doped gallium nitride.

16. The method of claim 12, wherein the first polar sidewall surface, the polarization layer, the doped semiconductor layer, the dielectric layer, and the gate electrode layer form a tunnel field effect transistor.

17. The method of claim 12, wherein an interface between the polarization layer and the first polar sidewall surface of the fin comprises an absolute localized interface polarization charge density between about $5 \times 10^{12}/cm^2$ and about $5 \times 10^{14}/cm^2$.

18. A method, comprising:
    forming a first fin with opposing first and second polar sidewall surfaces;
    growing a first polar layer on the first polar sidewall surface of the first fin;
    growing a second polar layer on the second polar sidewall surface of the first fin;
    forming a gate electrode material on the first and second polar layers, wherein the first fin, the first polar layer, the second polar layer, and the gate electrode material are included in a fin field effect transistor (finFET) inverter structure;
    forming a second fin with opposing first and second polar sidewall surfaces;
    growing a polarization layer on the first polar sidewall surface of the second fin;
    growing a doped semiconductor layer on the polarization layer; and
    forming a third dielectric layer on the doped semiconductor layer and the second polar sidewall surface of the second fin, wherein the gate electrode material on the third dielectric layer that is on the first polar sidewall surface of the second fin, the second fin, the polarization layer, the doped semiconductor layer, and the third dielectric layer are included in a tunnel finFET (TFET).

19. The method of claim 18, wherein the first polar sidewall surface of the second fin comprises an n-channel TFET or a p-channel TFET.

20. The method of claim 18, wherein the first polar sidewall surface of the first fin comprises an n-channel finFET and the second polar sidewall surface of the first fin comprises a p-channel finFET.

* * * * *